United States Patent
Das Sharma et al.

(10) Patent No.: US 12,155,474 B2
(45) Date of Patent: Nov. 26, 2024

(54) CHARACTERIZING AND MARGINING MULTI-VOLTAGE SIGNAL ENCODING FOR INTERCONNECTS

(71) Applicant: Intel Corporation, Santa Clara, CA (US)

(72) Inventors: Debendra Das Sharma, Saratoga, CA (US); Per E. Fornberg, Portland, OR (US); Tal Israeli, Pardes-Hana-Karkur (IL); Zuoguo Wu, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 819 days.

(21) Appl. No.: 17/086,085

(22) Filed: Oct. 30, 2020

(65) Prior Publication Data

US 2021/0050941 A1 Feb. 18, 2021

Related U.S. Application Data

(60) Provisional application No. 63/048,537, filed on Jul. 6, 2020.

(51) Int. Cl.
*H04L 1/00* (2006.01)
*H03M 13/00* (2006.01)
*H03M 13/09* (2006.01)

(52) U.S. Cl.
CPC .......... *H04L 1/0045* (2013.01); *H03M 13/09* (2013.01); *H04L 1/0057* (2013.01); *H04L 1/0063* (2013.01); *H04L 1/007* (2013.01)

(58) Field of Classification Search
CPC ... H04L 1/0045; H04L 1/0057; H04L 1/0063; H04L 1/007; H03M 13/09
See application file for complete search history.

(56) References Cited

U.S. PATENT DOCUMENTS

| | | | |
|---|---|---|---|
| 7,010,607 B1 | 3/2006 | Bunton | |
| 9,432,298 B1 | 8/2016 | Smith | |
| 9,648,148 B2 * | 5/2017 | Rimmer | H04L 49/70 |
| 9,887,804 B2 * | 2/2018 | Birrittella | H04L 1/0045 |
| 10,230,625 B2 * | 3/2019 | Maeda | H04L 45/22 |

(Continued)

FOREIGN PATENT DOCUMENTS

EP 3087710 A1 11/2016

OTHER PUBLICATIONS

USPTO; U.S. Appl. No. 16/947,558, filed Aug. 6, 2020; 59 pages.

(Continued)

*Primary Examiner* — Justin R Knapp
(74) *Attorney, Agent, or Firm* — Alliance IP, LLC

(57) ABSTRACT

Systems and apparatuses can include a receiver that includes port to receive a flow control unit (Flit) across a link, the link comprising a plurality of lanes. The receiver can also include error detection circuitry to determine an error in the Flit, an error counter to count a number of errors received, the error counter to increment based on an error detected in the Flit by the error detection circuitry, a Flit counter to count a number of Flits received, the Flit counter to increment based on receiving a Flit, and bit error rate logic to determine a bit error rate based on a count recorded by the error counter and a number of bits received as indicated by the Flit counter. The systems and apparatuses can apply processes to perform direct BER measurements at the receiver.

25 Claims, 17 Drawing Sheets

(56) References Cited

U.S. PATENT DOCUMENTS

| | | | |
|---|---|---|---|
| 10,261,880 B1 | 4/2019 | Levin et al. | |
| 10,409,744 B1 | 9/2019 | Gross et al. | |
| 10,528,421 B2* | 1/2020 | Tang | G06F 11/1068 |
| 2002/0172164 A1* | 11/2002 | Chou | H04L 9/40 |
| | | | 370/429 |
| 2006/0179394 A1 | 8/2006 | O'Neill et al. | |
| 2007/0101238 A1 | 5/2007 | Resnick et al. | |
| 2010/0162066 A1 | 6/2010 | Papirla et al. | |
| 2014/0112339 A1 | 4/2014 | Safranek et al. | |
| 2015/0131456 A1 | 5/2015 | Allmendinger et al. | |
| 2015/0281126 A1 | 10/2015 | Regula et al. | |
| 2016/0085619 A1* | 3/2016 | Iyer | H04L 1/0045 |
| | | | 714/807 |
| 2016/0147592 A1 | 5/2016 | Guddeti | |
| 2016/0179610 A1 | 6/2016 | Morris et al. | |
| 2016/0179710 A1 | 6/2016 | Sharma et al. | |
| 2016/0299860 A1 | 10/2016 | Harriman | |
| 2017/0019247 A1 | 1/2017 | Iyer et al. | |
| 2018/0181502 A1 | 6/2018 | Jen et al. | |
| 2018/0196103 A1 | 7/2018 | Champoux et al. | |
| 2018/0203963 A1 | 7/2018 | Eghbal et al. | |
| 2019/0042380 A1 | 2/2019 | Sharma et al. | |
| 2019/0149265 A1 | 5/2019 | Sharma | |
| 2019/0176838 A1 | 6/2019 | Kakoee et al. | |
| 2019/0305888 A1 | 10/2019 | Sharma | |
| 2020/0012555 A1 | 1/2020 | Sharma | |
| 2020/0118642 A1 | 4/2020 | Fuoco et al. | |
| 2020/0145341 A1 | 5/2020 | Sharma | |
| 2020/0364129 A1 | 11/2020 | Sharma | |
| 2020/0366573 A1 | 11/2020 | White et al. | |
| 2020/0366587 A1 | 11/2020 | White et al. | |
| 2021/0050941 A1 | 2/2021 | Sharma et al. | |
| 2021/0133019 A1 | 5/2021 | Dykstra et al. | |

OTHER PUBLICATIONS

USPTO; U.S. Appl. No. 17/031,822, filed Sep. 24, 2020; 55 pages.
USPTO; U.S. Appl. No. 17/115,168, filed Dec. 8, 2020; 63 pages.
EPO; Extended European Search Report issued in EP Patent Application No. 20210637.3, dated May 28, 2021; 8 pages.
EPO; Extended European Search Report issued in EP Patent Application No. 20216645.0, dated Jun. 8, 2021; 7 pages.
USPTO; US Non-Final Office Action for U.S. Appl. No. 17/031,822; 8 pages.
EPO Communication Pursuant to Article 94(3) in EP Application Serial No. EP20209707.7-1206 mailed on May 11, 2023 (6 pages).
USPTO; US Non-Final Office Action for U.S. Appl. No. 16/947,558; 15 pages.
EPO; Extended European Search Report issued in EP Patent Application No. 20209707.7, dated May 3, 2021; 13 pages.
Jackson, Mike, et al.; "PCI Express Technology Comprehensive Guide to Generations 1.x, 2.x, and 3.0," Mindshare Press; Sep. 1, 2012; 181 pages.
PCI Express Base Specification Revision 5.0, v. 1.0; pp. 97-98, 105-107, 198, 202, 233, 250; Peripheral Component Interconnect Special Interest Group; Beaverton, OR; May 22, 2019; 9 pages.
EPO; Extended European Search Report issued in EP Patent Application No. 20209957.8, dated May 10, 2021; 7 pages.
USPTO; US Final Office Action for U.S. Appl. No. 17/031,822; 9 pages.
USPTO; US Non-Final Office Action for U.S. Appl. No. 17/115,168; 30 pages.

* cited by examiner

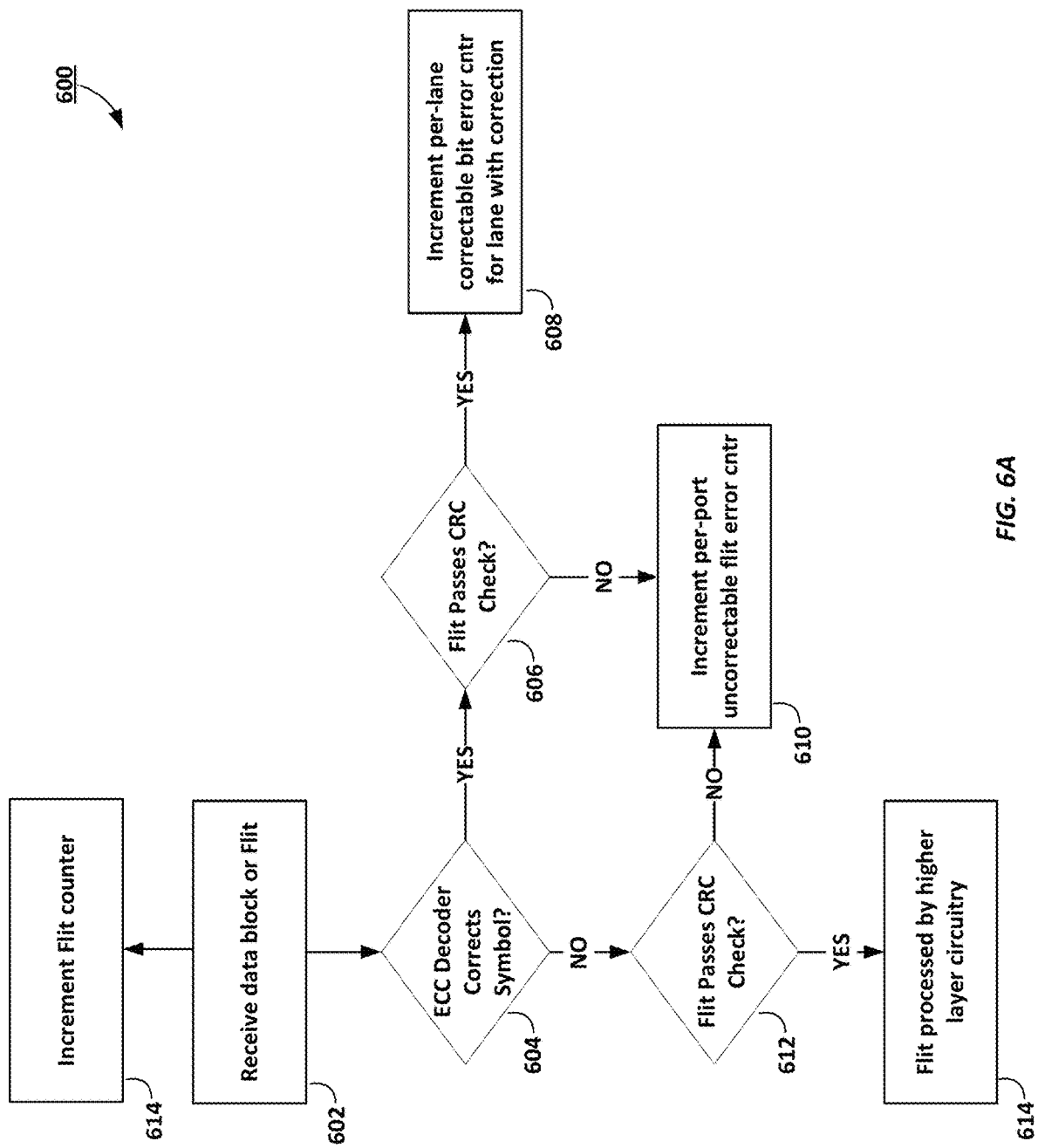

CHARACTERIZING AND MARGINING MULTI-VOLTAGE SIGNAL ENCODING FOR INTERCONNECTS

CROSS REFERENCE TO RELATED APPLICATION

Pursuant to 35 U.S.C. § 119(e), this application claims the benefit of U.S. Provisional Patent Application Ser. No. 63/048,537, titled, "CHARACTERIZING AND MARGINING MULTI-VOLTAGE SIGNAL ENCODING FOR INTERCONNECTS," filed on Jul. 6, 2020, the entire contents of which are incorporated by reference herein.

BACKGROUND

As data rates in serial interconnects increase for each PCIe generation, bit error rates (BER) of $10^{-12}$ are expected across every lane of the link. As the number of lanes of the link increases, BER can be impacted by cross-talk, inter-symbol interference (ISI), and channel loss arising from the socket, the vias, the board, the connector, and the add-in card (AIC), etc. With the deployment of PAM-4 encoding for the next generation data rates (e.g., PCIe Gen 6 at 64 GT/s along with the next generation of CXL and UPI data rates) the target BER is higher at $10^{-6}$.

BRIEF DESCRIPTION OF THE DRAWINGS

FIG. 6A is a process flow diagram for incrementing counters in a receiver in accordance with embodiments of the present disclosure.

Figure 1:
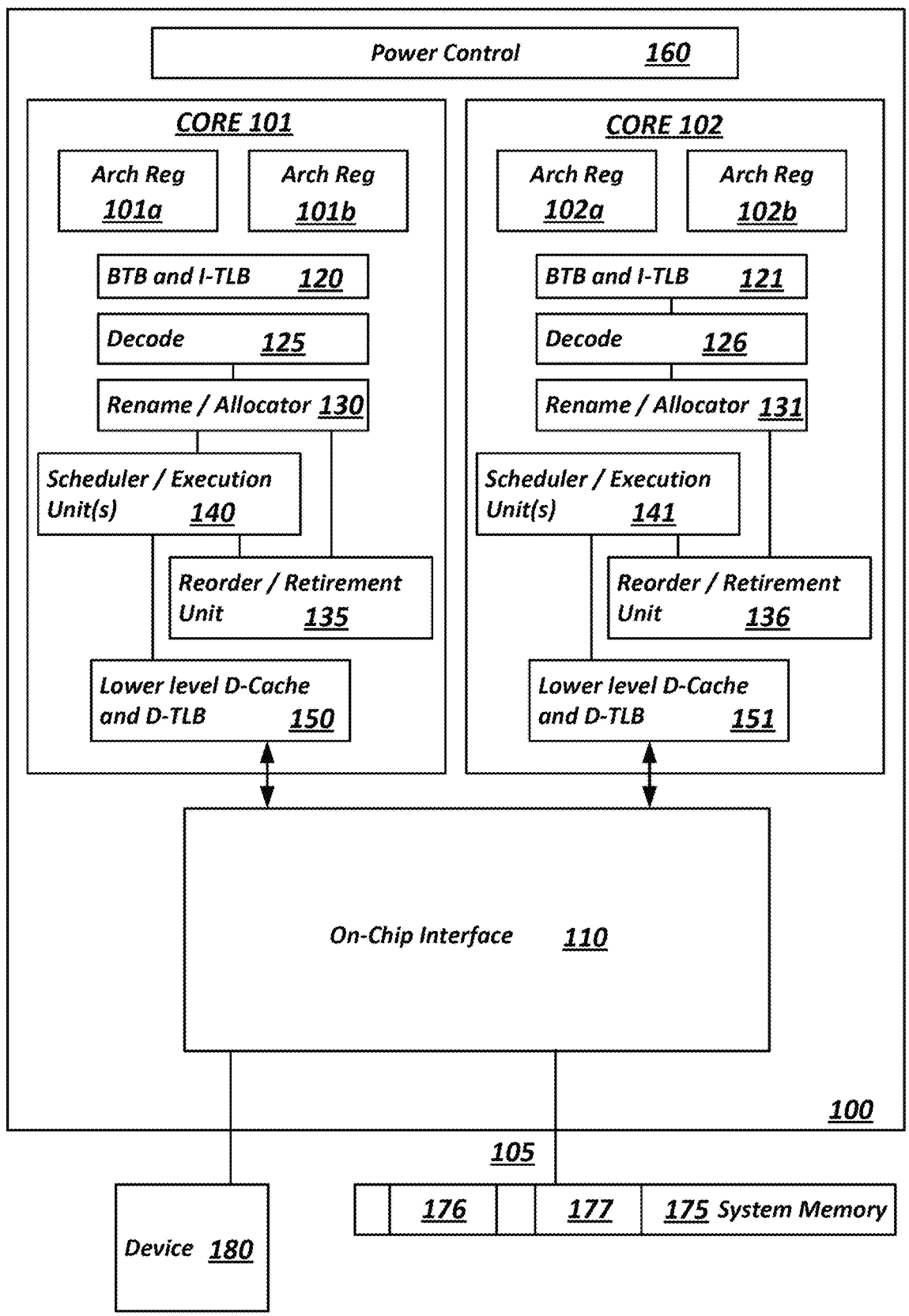
FIG. 1 illustrates an embodiment of a block diagram for a computing system including a multicore processor.

Figure are not drawn to scale.

DETAILED DESCRIPTION

In the following description, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present disclosure. It will be apparent, however, to one skilled in the art that these specific details need not be employed to practice the present disclosure. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system have not been described in detail in order to avoid unnecessarily obscuring the present disclosure.

Although the following embodiments may be described with reference to energy conservation and energy efficiency in specific integrated circuits, such as in computing platforms or microprocessors, other embodiments are applicable to other types of integrated circuits and logic devices. Similar techniques and teachings of embodiments described herein may be applied to other types of circuits or semiconductor devices that may also benefit from better energy efficiency and energy conservation. For example, the disclosed embodiments are not limited to desktop computer systems or Ultrabooks™. And may be also used in other devices, such as handheld devices, tablets, other thin notebooks, systems on a chip (SOC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below. Moreover, the apparatus', methods, and systems described herein are not limited to physical computing devices, but may also relate to software optimizations for energy conservation and efficiency. As will become readily apparent in the description below, the embodiments of methods, apparatus', and systems described herein (whether in reference to hardware, firmware, software, or a combination thereof) are vital to a 'green technology' future balanced with performance considerations.

As computing systems are advancing, the components therein are becoming more complex. As a result, the interconnect architecture to couple and communicate between the components is also increasing in complexity to ensure bandwidth requirements are met for optimal component operation. Furthermore, different market segments demand different aspects of interconnect architectures to suit the market's needs. For example, servers require higher performance, while the mobile ecosystem is sometimes able to sacrifice overall performance for power savings. Yet, it is a singular purpose of most fabrics to provide highest possible performance with maximum power saving. Below, a number of interconnects are discussed, which would potentially benefit from aspects of the disclosure described herein.

Referring to FIG. 1, an embodiment of a block diagram for a computing system including a multicore processor is depicted. Processor 100 includes any processor or processing device, such as a microprocessor, an embedded processor, a digital signal processor (DSP), a network processor, a handheld processor, an application processor, a co-processor, a system on a chip (SOC), or other device to execute code. Processor 100, in one embodiment, includes at least two cores—core 101 and 102, which may include asymmetric cores or symmetric cores (the illustrated embodiment). However, processor 100 may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core often refers to logic located on an integrated circuit capable of maintaining an independent architectural state, wherein each independently maintained architectural state is associated with at least some dedicated execution resources. In contrast to cores, a hardware thread typically refers to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

Physical processor 100, as illustrated in FIG. 1, includes two cores—core 101 and 102. Here, core 101 and 102 are considered symmetric cores, i.e. cores with the same configurations, functional units, and/or logic. In another embodiment, core 101 includes an out-of-order processor core, while core 102 includes an in-order processor core. However, cores 101 and 102 may be individually selected from any type of core, such as a native core, a software managed core, a core adapted to execute a native Instruction Set Architecture (ISA), a core adapted to execute a translated Instruction Set Architecture (ISA), a co-designed core, or other known core. In a heterogeneous core environment (i.e. asymmetric cores), some form of translation, such a binary translation, may be utilized to schedule or execute code on one or both cores. Yet to further the discussion, the functional units illustrated in core 101 are described in further detail below, as the units in core 102 operate in a similar manner in the depicted embodiment.

As depicted, core 101 includes two hardware threads 101a and 101b, which may also be referred to as hardware thread slots 101a and 101b. Therefore, software entities, such as an operating system, in one embodiment potentially view processor 100 as four separate processors, i.e., four logical processors or processing elements capable of executing four software threads concurrently. As alluded to above, a first thread is associated with architecture state registers 101a, a second thread is associated with architecture state registers 101b, a third thread may be associated with architecture state registers 102a, and a fourth thread may be associated with architecture state registers 102b. Here, each of the architecture state registers (101a, 101b, 102a, and 102b) may be referred to as processing elements, thread slots, or thread units, as described above. As illustrated, architecture state registers 101a are replicated in architecture state registers 101b, so individual architecture states/contexts are capable of being stored for logical processor 101a and logical processor 101b. In core 101, other smaller resources, such as instruction pointers and renaming logic in allocator and renamer block 130 may also be replicated for threads 101a and 101b. Some resources, such as re-order buffers in reorder/retirement unit 135, ILTB 120, load/store buffers, and queues may be shared through partitioning. Other resources, such as general purpose internal registers, page-table base register(s), low-level data-cache and data-TLB 115, execution unit(s) 140, and portions of out-of-order unit 135 are potentially fully shared.

Processor 100 often includes other resources, which may be fully shared, shared through partitioning, or dedicated by/to processing elements. In FIG. 1, an embodiment of a purely exemplary processor with illustrative logical units/resources of a processor is illustrated. Note that a processor may include, or omit, any of these functional units, as well as include any other known functional units, logic, or firmware not depicted. As illustrated, core 101 includes a simplified, representative out-of-order (OOO) processor core. But an in-order processor may be utilized in different embodiments. The OOO core includes a branch target buffer 120 to predict branches to be executed/taken and an instruction-translation buffer (I-TLB) 120 to store address translation entries for instructions.

Core 101 further includes decode module 125 coupled to fetch unit 120 to decode fetched elements. Fetch logic, in one embodiment, includes individual sequencers associated with thread slots 101a, 101b, respectively. Usually core 101 is associated with a first ISA, which defines/specifies instructions executable on processor 100. Often machine code instructions that are part of the first ISA include a portion of the instruction (referred to as an opcode), which references/specifies an instruction or operation to be performed. Decode logic 125 includes circuitry that recognizes these instructions from their opcodes and passes the decoded instructions on in the pipeline for processing as defined by the first ISA. For example, as discussed in more detail below decoders 125, in one embodiment, include logic designed or adapted to recognize specific instructions, such as transactional instruction. As a result of the recognition by decoders 125, the architecture or core 101 takes specific, predefined actions to perform tasks associated with the appropriate instruction. It is important to note that any of the tasks, blocks, operations, and methods described herein may be performed in response to a single or multiple instructions; some of which may be new or old instructions. Note decoders 126, in one embodiment, recognize the same ISA (or a subset thereof). Alternatively, in a heterogeneous core environment, decoders 126 recognize a second ISA (either a subset of the first ISA or a distinct ISA).

In one example, allocator and renamer block 130 includes an allocator to reserve resources, such as register files to store instruction processing results. However, threads 101a and 101b are potentially capable of out-of-order execution, where allocator and renamer block 130 also reserves other resources, such as reorder buffers to track instruction results. Unit 130 may also include a register renamer to rename program/instruction reference registers to other registers internal to processor 100. Reorder/retirement unit 135 includes components, such as the reorder buffers mentioned above, load buffers, and store buffers, to support out-of-order execution and later in-order retirement of instructions executed out-of-order.

Scheduler and execution unit(s) block 140, in one embodiment, includes a scheduler unit to schedule instructions/operation on execution units. For example, a floating point instruction is scheduled on a port of an execution unit that has an available floating point execution unit. Register files associated with the execution units are also included to store information instruction processing results. Exemplary execution units include a floating point execution unit, an integer execution unit, a jump execution unit, a load execution unit, a store execution unit, and other known execution units.

Lower level data cache and data translation buffer (D-TLB) 150 are coupled to execution unit(s) 140. The data cache is to store recently used/operated on elements, such as data operands, which are potentially held in memory coherency states. The D-TLB is to store recent virtual/linear to physical address translations. As a specific example, a processor may include a page table structure to break physical memory into a plurality of virtual pages.

Here, cores 101 and 102 share access to higher-level or further-out cache, such as a second level cache associated with on-chip interface 110. Note that higher-level or further-out refers to cache levels increasing or getting further way from the execution unit(s). In one embodiment, higher-level cache is a last-level data cache—last cache in the memory hierarchy on processor 100—such as a second or third level data cache. However, higher level cache is not so limited, as it may be associated with or include an instruction cache. A trace cache—a type of instruction cache—instead may be coupled after decoder 125 to store recently decoded traces. Here, an instruction potentially refers to a macro-instruction (i.e. a general instruction recognized by the decoders), which may decode into a number of micro-instructions (micro-operations).

In the depicted configuration, processor 100 also includes on-chip interface module 110. Historically, a memory controller, which is described in more detail below, has been included in a computing system external to processor 100. In this scenario, on-chip interface 11 is to communicate with devices external to processor 100, such as system memory 175, a chipset (often including a memory controller hub to connect to memory 175 and an I/O controller hub to connect peripheral devices), a memory controller hub, a northbridge, or other integrated circuit. And in this scenario, bus 105 may include any known interconnect, such as multi-drop bus, a point-to-point interconnect, a serial interconnect, a parallel bus, a coherent (e.g. cache coherent) bus, a layered protocol architecture, a differential bus, and a GTL bus.

Memory 175 may be dedicated to processor 100 or shared with other devices in a system. Common examples of types of memory 175 include DRAM, SRAM, non-volatile memory (NV memory), and other known storage devices. Note that device 180 may include a graphic accelerator, processor or card coupled to a memory controller hub, data storage coupled to an I/O controller hub, a wireless transceiver, a flash device, an audio controller, a network controller, or other known device.

Recently however, as more logic and devices are being integrated on a single die, such as SOC, each of these devices may be incorporated on processor 100. For example in one embodiment, a memory controller hub is on the same package and/or die with processor 100. Here, a portion of the core (an on-core portion) 110 includes one or more controller(s) for interfacing with other devices such as memory 175 or a graphics device 180. The configuration including an interconnect and controllers for interfacing with such devices is often referred to as an on-core (or un-core configuration). As an example, on-chip interface 110 includes a ring interconnect for on-chip communication and a high-speed serial point-to-point link 105 for off-chip communication. Yet, in the SOC environment, even more devices, such as the network interface, co-processors, memory 175, graphics processor 180, and any other known computer devices/interface may be integrated on a single die or integrated circuit to provide small form factor with high functionality and low power consumption.

In one embodiment, processor 100 is capable of executing a compiler, optimization, and/or translator code 177 to compile, translate, and/or optimize application code 176 to support the apparatus and methods described herein or to interface therewith. A compiler often includes a program or set of programs to translate source text/code into target text/code. Usually, compilation of program/application code with a compiler is done in multiple phases and passes to transform hi-level programming language code into low-level machine or assembly language code. Yet, single pass compilers may still be utilized for simple compilation. A compiler may utilize any known compilation techniques and perform any known compiler operations, such as lexical analysis, preprocessing, parsing, semantic analysis, code generation, code transformation, and code optimization.

Larger compilers often include multiple phases, but most often these phases are included within two general phases: (1) a front-end, i.e. generally where syntactic processing, semantic processing, and some transformation/optimization may take place, and (2) a back-end, i.e. generally where analysis, transformations, optimizations, and code generation takes place. Some compilers refer to a middle, which illustrates the blurring of delineation between a front-end and back end of a compiler. As a result, reference to insertion, association, generation, or other operation of a compiler may take place in any of the aforementioned phases or passes, as well as any other known phases or passes of a compiler. As an illustrative example, a compiler potentially inserts operations, calls, functions, etc. in one or more phases of compilation, such as insertion of calls/operations in a front-end phase of compilation and then transformation of the calls/operations into lower-level code during a transformation phase. Note that during dynamic compilation, compiler code or dynamic optimization code may insert such operations/calls, as well as optimize the code for execution during runtime. As a specific illustrative example, binary code (already compiled code) may be dynamically optimized during runtime. Here, the program code may include the dynamic optimization code, the binary code, or a combination thereof.

Similar to a compiler, a translator, such as a binary translator, translates code either statically or dynamically to optimize and/or translate code. Therefore, reference to execution of code, application code, program code, or other software environment may refer to: (1) execution of a compiler program(s), optimization code optimizer, or translator either dynamically or statically, to compile program code, to maintain software structures, to perform other operations, to optimize code, or to translate code; (2) execution of main program code including operations/calls, such as application code that has been optimized/compiled; (3) execution of other program code, such as libraries, associated with the main program code to maintain software structures, to perform other software related operations, or to optimize code; or (4) a combination thereof.

As serial interconnects continue to increase (double) in data rates, such as can be seen for each PCIe generation, maintaining a bit error rate (BER) of $10^{-12}$ or better with the hundreds of lanes per system on chip (SoC) becomes difficult due to various elements contributing to cross-talk, inter-symbol interference (ISI), and channel loss arising from the socket, the vias, the board, the connector, and the add-in card (AIC). With the deployment of PAM-4 encoding for the next generation data rates (e.g., PCIe (Gen 6 at 64 GT/s along with the next generation of Compute Express Link (CXL) and Ultra Path Interconnect (UPI) data rates) the target BER is much higher at $10^{-6}$. The nature of errors expected at these higher data rates are expected to be correlated between consecutive bits on the same lane (burst errors) due to the decision feedback equalizer (DFE). The nature of these errors is also expected to have correlation between errors across lanes since the lanes share the same source of error such as power supply noise, clock jitter on the TX side, etc.

This disclosure describes mechanisms and logic circuitry to address error bursts on each lane as well as across lanes during operation of the link. In addition, the disclosure describes mechanisms and logic circuitry to facilitate the evaluation of the error correlation of errors in addition to the raw first burst error rate (FBER) so that the circuits can be tuned to reduce the correlation or channel improvements can be deployed prior to shipping a product. Further, depending on the nature of correlation of errors within a lane as well as across lanes, different Forward Error Correction (FEC) can be deployed to address the errors; such FEC can include one or more (interleaved) Error Correcting Code (ECC) group(s) and/or Cyclic Redundancy Check (CRC).

Figure 2A:
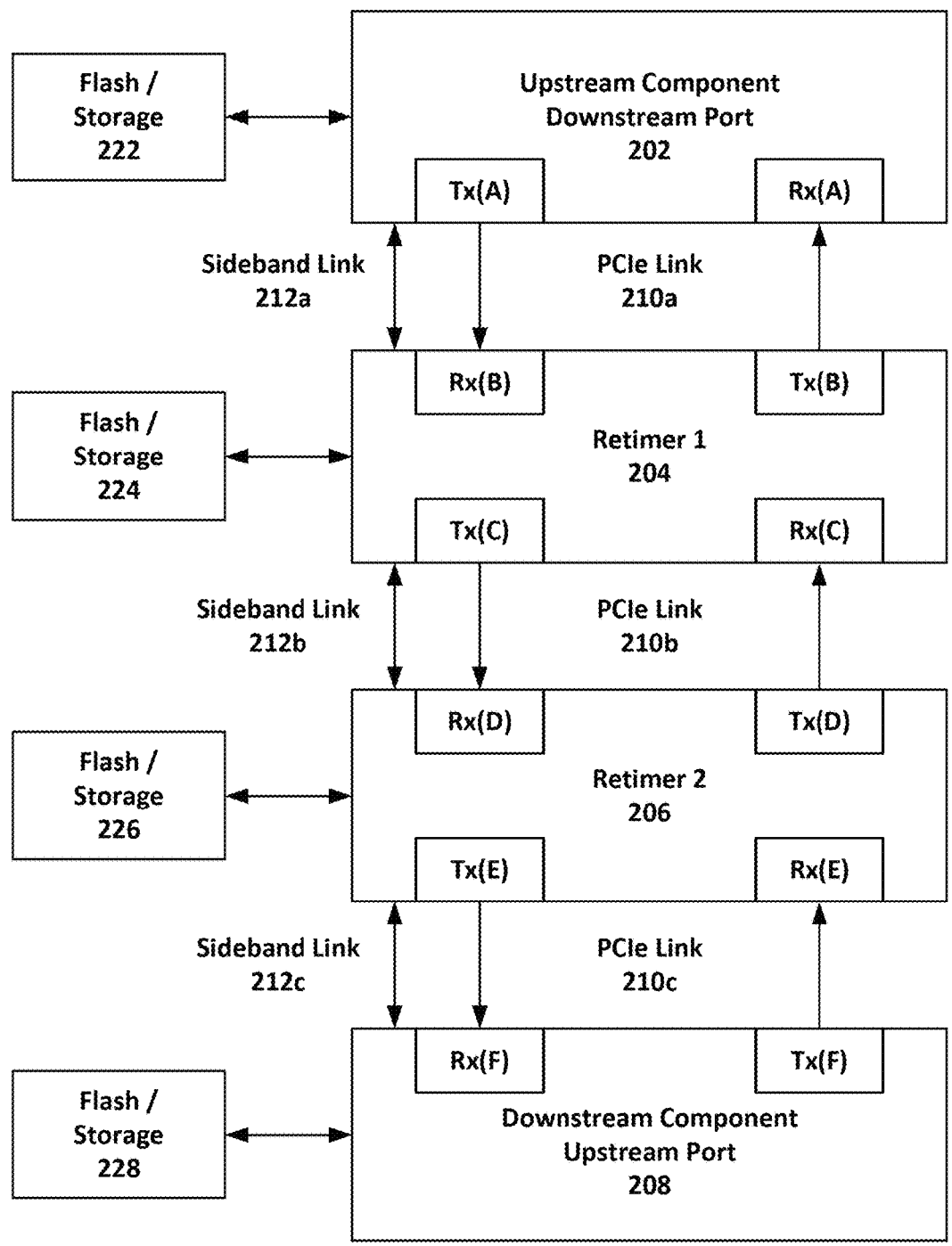
FIGS. 2A-2B are simplified block diagrams of example links that include one or more retimers in accordance with embodiments of the present disclosure.
Figure 2B:
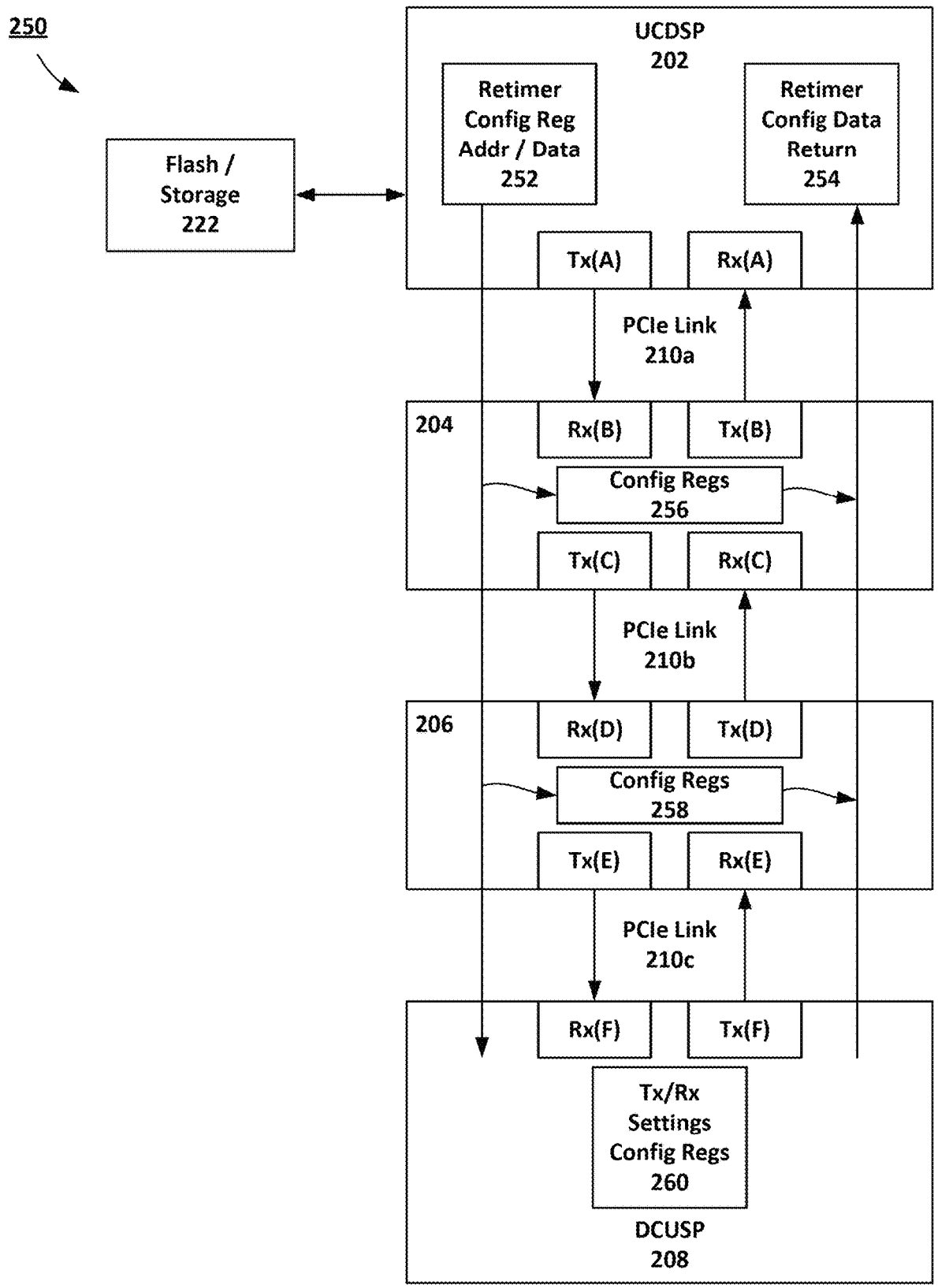

FIGS. 2A-2B show a sample multilane link. If one or more retimer(s) is present, then each link segment is electrically independent and can accumulate errors in each receiver independently. Thus, with one retimer, an error may be introduced in the receiver of the retimer or the receiver of the port. Retimers operate on a per-lane basis and hence do not correct or detect any errors in the Flit which operates across all lanes in the link. Though shown to include retimers, it is understood that the use of retimers is implementation-specific.

FIG. 2A is a schematic diagram illustrating a sample topology 200 with two re-timers 204 and 206 between an upstream component downstream port 202 and a downstream component upstream port 208 in accordance with embodiments of the present disclosure. The upstream component downstream port 202 can be a port for a PCIe-based device, such as a CPU or other device capable of generating a data packet and transmitting the data packet across a data Link compliant with the PCIe protocol. The downstream component upstream port 208 can be a port for a peripheral component that can receive a data packet from a Link compliant with the PCIe protocol. It is understood that the upstream component downstream port 202 and the downstream component upstream port 208 can transmit and receive data packets across PCIe Link(s), illustrated as PCIe Link 210a-c.

The topology 200 can include one or more retimers 204 and 206. Retimers 204 and 206 can serve as a signal repeater operating at the physical layer to fine tune the signal from the upstream component 202 and/or the downstream component upstream port 208. A retimer can use Continuous Time Linear Equalization (CTLE), Decision Feedback Equalization (DFE), and transmit an impulse response equalization (Tx FIR EQ, or just TxEQ). Re-timers are transparent to the data Link and transaction layers but implement the full physical layer.

The multi-Lane PCIe Link is split into three Link segments (LS) 210a, 210b, and 210c in each direction. The upstream component downstream port 202 can be coupled to retimer 1 204 by a multi-Lane PCIe Link 210a. The retimer 1 204 can be coupled to retimer 2 206 by link segment 210b. And retimer 2 206 can be coupled to downstream component upstream port 208 by link segment 210c.

Components can also be coupled by sideband linkages. The upstream component downstream port 202 can be coupled to retimer 1 204 by a sideband link 212a. The retimer 1 204 can be coupled to retimer 2 206 by sideband link 212b. And retimer 2 206 can be coupled to downstream component upstream port 208 by sideband link 212c.

A primary function of a retimer (buffer) device is signal re-timing. These functions are performed by retimers 204 and 206. The particular retimer device circuits will depend on the PHY being used for the link. Generally, retimer circuitry is configured to recover the incoming signal and retransmit using a local clock and new transmit equalization circuitry, and may typically employ well-known circuitry for this purpose, such as phase lock loops. A retimer may further comprise transmitter and receiver circuitry including one or more amplifier circuits, as well as various types of well-known signal-conditioning circuitry used to increase the drive level of a received signal. Such retimer circuitry is well-known to those skilled in the high-speed interconnect arts, and, accordingly, no further details are shown or discussed herein.

Each retimer 204 and 206 can have an upstream path and a downstream path. In some implementations, a retimer can include two pseudo ports, and the pseudo ports can determine their respective downstream/upstream orientation dynamically. Further, retimers 204 and 206 can support operating modes including a forwarding mode and an executing mode. Retimers 204 and 206 in some instances can decode data received on the sub-link and re-encode the data that it is to forward downstream on its other sublink. As such, retimers may capture the received bit stream prior to regenerating and re-transmitting the bit stream to another device or even another retimer (or redriver or repeater). In some cases, the retimer can modify some values in the data it receives, such as when processing and forwarding ordered set data. Additionally, a retimer can potentially support any width option as its maximum width, such as a set of width options defined by a specification such as PCIe.

As data rates of serial interconnects (e.g., PCIe, UPI, USB, etc.) increase, retimers are increasingly used to extend the channel reach. Multiple retimers can be cascaded for even longer channel reach. It is expected that as signal speeds increase, channel reach will typically decrease as a general matter. Accordingly, as interconnect technologies accelerate, the use of retimers may become more common. As an example, as PCIe Gen-4, with its 16 GT/s, is adopted in favor of PCIe Gen-3 (8 GT/s), the use of retimers in PCIe interconnects may increase, as may be the case in other interconnects as speeds increase.

In one implementation, a common BGA (Ball Grid Array) footprint may be defined for PCI Express Gen-4 (16 GT/s) based retimers. Such a design may address at least some of the example shortcomings found in conventional PCIe Gen-3 (8 GT/s) retimer devices, as well as some of the issues emerging with the adoption of PCIe Gen-4. Further, for PCIe Gen-4, the number of retimer vendors and volume are expected to increase. Due to signal losses from the doubled data rate (from 8 GT/s to 16 GT/s), the interconnect length achievable is significantly decreased in Gen-4. In this and other example interconnect technologies, as data rate increases, retimers may thereby have increased utility as they can be used to dramatically increase channel lengths that would be otherwise constrained by the increased data rate, such as in PCIe Gen 5 and Gen 6 and beyond.

Although shown to be separate from the upstream component and downstream component, the retimer can be part of the upstream or downstream components, on board with the upstream or downstream components, or on package with the downstream component.

The upstream component downstream port 202 can have access to a storage element 222, such as a flash storage, cache, or other memory device. The retimer 1 204 can optionally include a similar storage element 224. The retimer 2 206 can optionally include a similar storage element 226. The downstream component upstream port 208 can optionally include a similar storage element 228.

FIG. 2B is a schematic diagram of a connected system 250 that illustrates in-band upstream port and retimer configuration in accordance with embodiments of the present disclosure. As shown in FIG. 2A, an upstream component downstream port 202 can be coupled to the downstream component upstream port 208 by a link 210*a-c* that is extended by two retimers 204, 206. In this example, the downstream port 202 can be provided with a retimer configuration register address/data register 252 to hold data to be sent in a configuration access command to one of the two retimers using fields of an enhanced SKP OS. One or more bits of the SKP OS can include a command code, data, or an address for use at a configuration register (e.g., 256, 258) of a retimer (e.g., 204, 206, respectively) to read or write data from/to the register 256, 258. Retimers can respond to configuration access commands sent by encoding data in an instance of an enhanced SKP OS by itself encoding response data in a subsequent instance of an enhanced SKP OS. Data encoded by the retimer (e.g., 204, 206) may be extracted at the downstream port and recorded in a retimer configuration data return register (e.g., 254). The registers (e.g., 252, 254) maintained at the upstream device downstream port 202 can be written to and read from by system software and/or other components of the system allowing (indirect) access to the retimer registers: one register (e.g., 252) conveying the address/data/command to the retimer and a second register (e.g., 254) that stores the responses coming back from the re-timer. In other implementations, such registers (e.g., 260) can be maintained at the downstream component upstream port 208 instead of or in addition to the registers being maintained at the upstream component downstream port 202, among other examples.

Continuing with the example of FIG. 2B, in connection with a mechanism for providing in-band access to retimer registers, the retimer may have architected registers that are addressable with well-defined bits and characteristics. In this example, an enhanced SKP OS is defined/modified as the physical layer-generated periodic pattern to carry the commands/information from "Retimer Config Reg Addr/Data" (e.g., 252) to the re-timers and carrying the responses from the re-timers back to load to "Retimer Config Data Return" (e.g., 840), with some bits allotted for CRC for the protection of data. For example, in PCIe this can include enhancing the existing SKP Ordered Set (e.g., with CSR Access and CSR Return (CRC-protected bits)). Further, a flow for ensuring guaranteed delivery of the commands/information to retimer and the corresponding response back can be defined. The physical layer mechanism can be enhanced to also include notifications from the re-timer (in addition to response) if it needs some sort of service, among other examples features.

If one or more retimer(s) is present, then each link segment is electrically independent and can accumulate errors in each Receiver independently. Thus, with one Retimer, an error may be introduced in the Receiver of the Retimer or the Receiver of the Port. Retimers operate on a per-Lane basis and hence do not correct or detect any errors in the Flit which operates across all Lanes in the Link.

PCIe Gen 6 (PCI Express $6^{th}$ Generation) at 64.0 GT/s, CXL 3.0 (Compute Express Link $3^{rd}$ Generation) at 64.0 GT/s, and CPU-CPU symmetric coherency links such as UPI (Ultra Path Interconnect) at frequencies above 32.0 GT/s (e.g., 48.0 GT/s or 56.0 GT/s or 64.0 GT/s) are examples of interconnects that will need FEC to work in conjunction with CRC. In SoCs, it is highly desirable for the same PHY to be multi-protocol capable and used as PCIe/CXL/UPI depending on the device connected as the Link partner.

In embodiments of this disclosure, multiple protocols (e.g., PCIe, CXL, UPI) may share a common PHY. Each protocol, however, may have different latency tolerance and bandwidth demands. For example, PCIe may be more tolerant to a latency increase than CXL. CPU-CPU symmetric cache coherent links such as UPI are most sensitive to latency increases.

Links such as PCIe and CXL can be partitioned into smaller independent sub-links. For example, a x16 PCIe/CXL link may be partitioned to up to 8 independent links of x2 each. A symmetric cache coherent link may not support that level of partitioning. Due to the differences in latency characteristics, partitioning support, as well as due to fundamental protocol differences, these links may use different flow control unit (Flit) sizes and Flit arrangements, even though they may share the same physical layer.

In addition to the differing performance and operating conditions of the various protocols mentioned above, the operating conditions and performance requirements may also change for any given protocol. Operating conditions may have an impact on the error rate and correlation between errors, depending on the system and any variations in the process, voltage, and temperature. Similarly, different applications may have different latency and bandwidth requirements. This disclosure describes mechanisms that can dynamically adjust to these variations.

Figure 3:
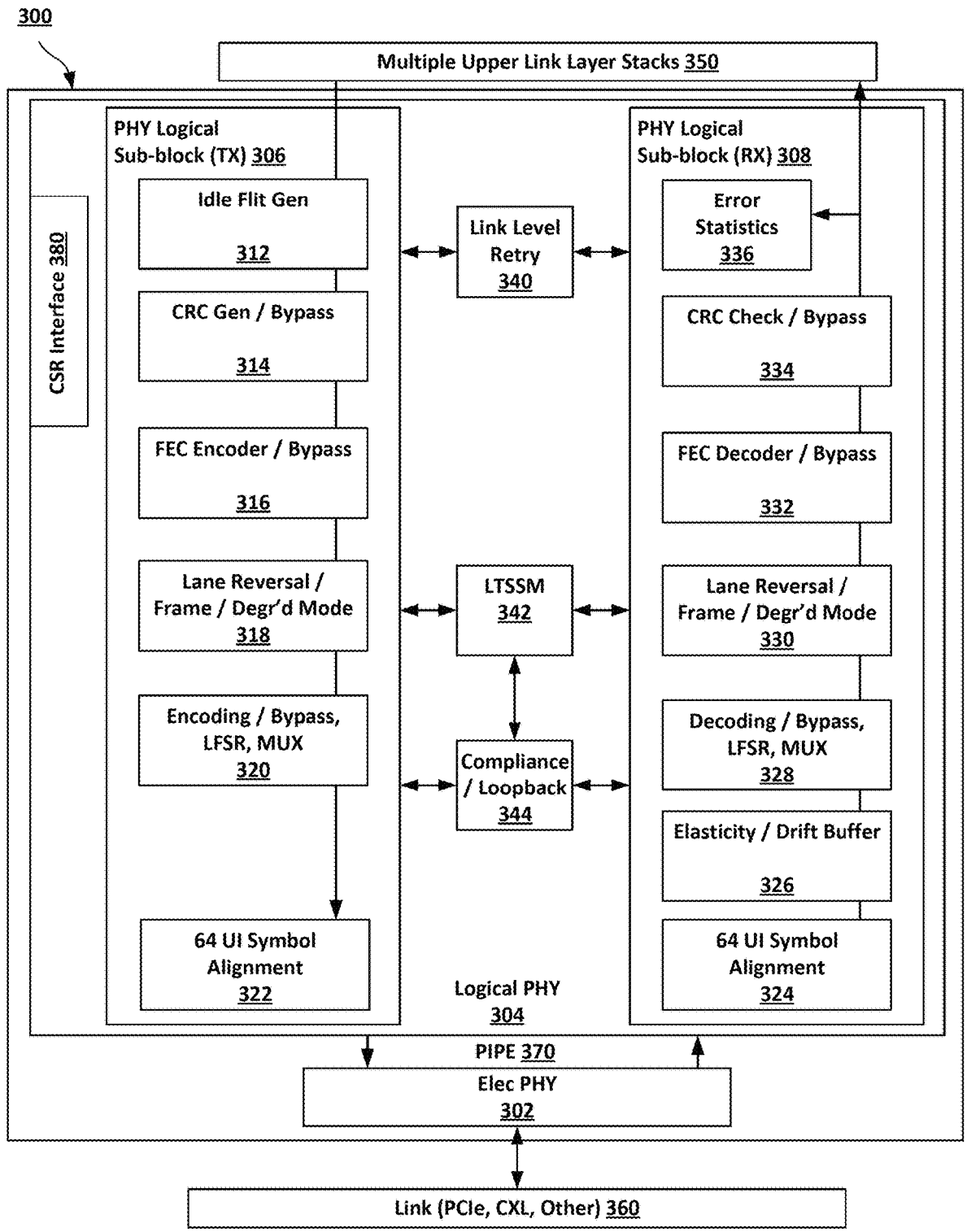
FIG. 3 is a schematic diagram of a common physical layer (common PHY) to support multiple interconnect protocols in accordance with embodiments of the present disclosure.

FIG. 3 is a schematic diagram of a common physical layer (common PHY) 300 to support multiple interconnect protocols in accordance with embodiments of the present disclosure. A PHY is an abbreviation for "physical layer," and is an electronic circuit that can implement physical layer functions of the OSI model.

FIG. 3 illustrates an example common PHY 300 (both analog PHY as well as Logical PHY) with PAM-4 encoding at higher data rates that can support multiple protocols (e.g., PCIe, CXL, UPI, Cache Coherent Interconnect for Accelerators (CCIX), Open Coherent Accelerator Processor Interface (CAPI), etc.) operating at different data rates. Both the analog PHY 302 and the Logical PHY 304 are common to each protocol supported. The analog PHY 302 can support a multi-lane link, such as an x16 PCIe link, with 48 GT/s and 56 GT/s PAM-4 for other interconnect protocols.

The logical PHY 304 can include a TX logical sub-block 306 and an RX logical sub-block 308. The TX logical sub-block 306 can include logic to prepare the data stream for transmission across the link. For example, the TX logical sub-block 306 can include an Idle Flit Generator 312 to generate Flits. Flit sizes can be determined based on the protocol, bandwidth, operation conditions, protocol being used, etc. A cyclic redundancy check (CRC) code generator 314 can include one or more CRC code generators and rolling CRC code generators for generating CRC codes. CRC codes are error-detecting codes to detect accidental changes to the data. In embodiments, the CRC code generator 314 can be bypassed while maintaining clock integrity. The TX logical sub-block 306 can also include a forward error correction (FEC) encoder 316, to encode the data with error correcting code (ECC). The FEC encoder 316 can also be bypassed without compromising clock integrity. Other logical elements can also be present in the TX logical sub-block 306, such as lane reversal 318, LFSR 320, symbol alignment 322, etc. The logical PHY can also include a common retry buffer 340, since all the protocols are Flit based.

The logical PHY can include an RX logical sub-block 308. RX logical sub-block 308 can include an FEC decoder/bypass 322, CRC decode/bypass 334, and an error reporting element 336. The FEC decoder 332 can decode ECC bits in received data blocks and perform error correction. The CRC decode logic 334 can check for errors that are not correctable and report errors to the error reporting element 336. The retry buffer 340 can be used to signal retry of data blocks with uncorrectable errors. Other logical elements can also be present in the RX logical sub-block 308, such as lane reversal 330, LFSR 328, elasticity/drift buffer 328, symbol alignment 324, etc.

The logical PHY 304 may also include a static mux (not shown in the figure) to choose between the different protocol stacks the PHY 300 supports. The use of a static MUX facilitates reuse of logic elements (including substantial part of what is traditionally a link layer function, such as CRC and Retry), and results in area/power efficiency in addition to the pin efficiency and flexible I/O support (the ability to choose between the different protocol depending on the system configuration). The static mux can direct data towards the appropriate physical and logical elements based on Flit size associated with the protocol being used, and direct the data towards the appropriate CRC encoders/decoders and FEC encoders/decoders.

The use of a common PHY 300 (analog PHY 302 plus Logical PHY 304), the Flit size, FEC, and CRC can be potentially different between different protocols and operating conditions. Any additional logic to facilitate the common PHY is less costly than replicating the logical PHY stack multiple times for each protocol. Instead, data can be directed electrically to the appropriate encoders/decoders based on the protocol being used, which is set initially during link initialization.

This disclosure describes systems and techniques to measure and characterize the margin of a link, both in test mode as well as during normal operation of the link (i.e., link in L0 state). The disclosed systems and techniques result in characterizing the Link which will help in qualifying the link and fixing any issues with a time to market advantage. The link can be margined without introducing errors that is inherent in an indirect scheme such as Receiver margining where the link will be margined till failure. The TX jitter measurement helps with the jitter measurement in PAM-4. With the third approach, one can test the Link intermittently by cycle stealing from regular traffic or perform dedicated testing.

The nature of errors expected at high data rates can be correlated between consecutive bits on the same lane (burst errors) due to the decision feedback equalizer (DFE). Correlation between errors across lanes is expected because the Lanes share the same source of error, such as power supply noise, clock jitter on the TX side, etc. Understanding errors and measuring the margin of individual components as well as at the system level in the presence of Retimer(s) helps to maintain high data rates while anticipating and accounting for errors.

Figure 4A:
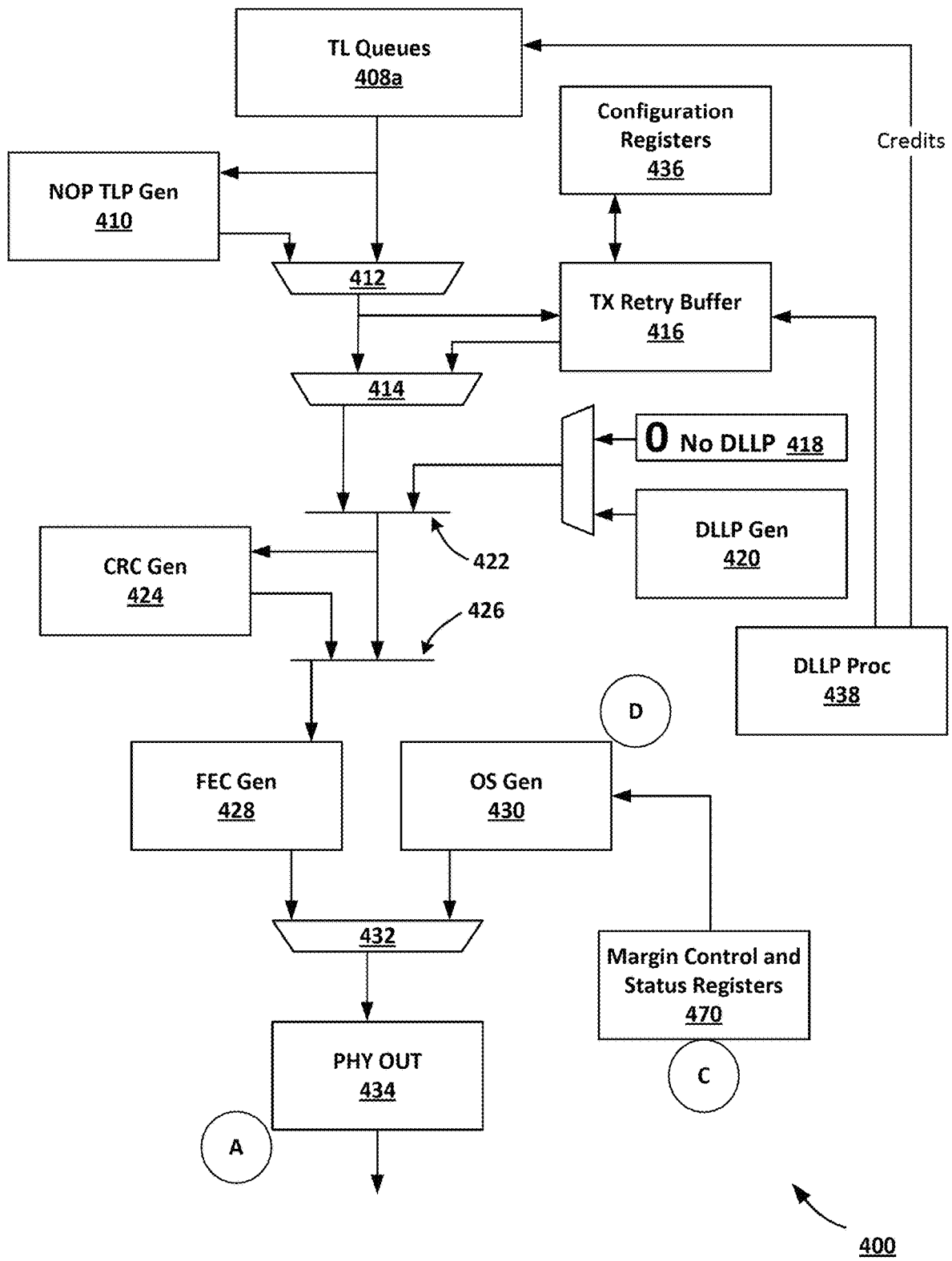
FIGS. 4A-B are schematic diagrams illustrating example circuitry and logic within a protocol stack including Flit error counters and jitter insertion circuitry in accordance with embodiments of the present disclosure.
Figure 4B:
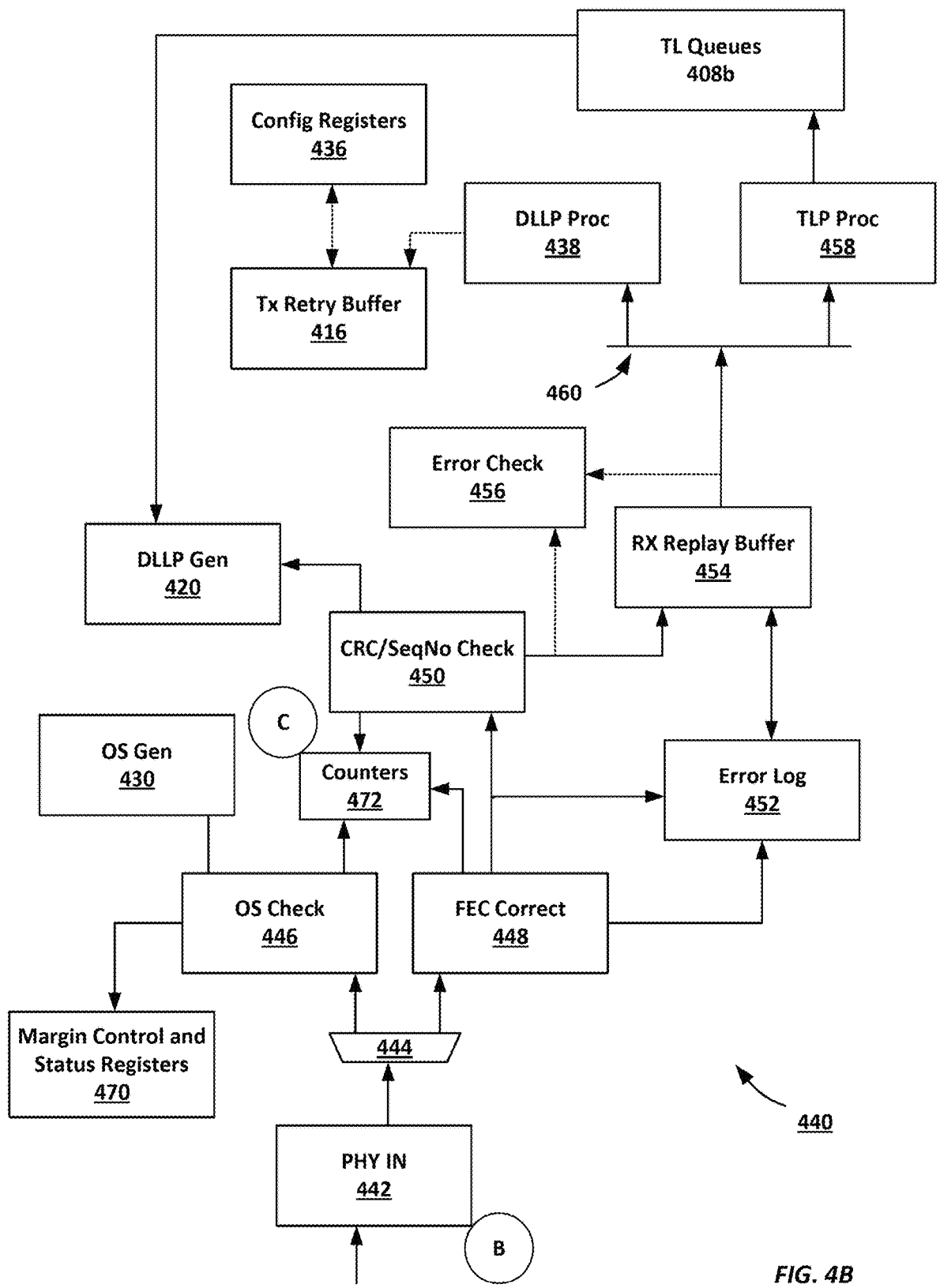

FIGS. 4A-B are schematic diagrams illustrating example circuitry and logic within a protocol stack including error logging mechanisms in accordance with embodiments of the present disclosure. FIGS. 4A-B demonstrate an example micro-architecture implementing the physical, link, and transaction layers of serial interconnects such as PCIe/CXL/UPI. The disclosure describes multiple detection and logging mechanisms, as shown in FIGS. 4A-B.

FIG. 4A illustrates a logic circuitry of a protocol stack 400 of a transmitter side of the microarchitecture. The protocol stack 400 can include transaction layer (TL) queues 408a, a No Operation transaction layer packet (NOP TLP) generator 410, and a TX retry buffer 416. The TL queues 408a can include logic to store or buffer outbound transaction layer information, payload data, control data, etc. for an outbound packet. The NOP TLP generator 410 can generate NOP TLPs that can be included in a NOP Flit that is transmitted by the transmitter across the link. A NOP Flit can be considered a Flit that does not contain transaction layer packet. In some instances, the NOP Flit can include no DLLP payload (i.e., all 0s in DLLP payload). This will be referred to as an IDLE Flit. In some instances, a NOP Flit (specifically the IDLE Flit type) can be transmitted for the receiver to use to check errors and increase the likelihood of retried packets being corrected. Information from TL queues 408a can be muxed with information from the NOP TLP Gen 410 by mux 412.

The TX retry buffer 416 can be used to temporarily store packets (TLP payload) for retransmission if an error occurred during a previous Flit or the current Flit. A portion of the TX retry buffer 416 can be repurposed for storing error information in some implementations, such as those without available configuration register space. The DLLP processor 438 (on the receiver side protocol stack 440) can provide an ACK/NACK response to the retry buffer 416 to either cause the TLP in the retry buffer 416 to resend or to clear. The DLLP processor 438 can use information about errors in a Flit to cause a new Flit to be transmitted across the link.

The protocol stack 400 can include a data link layer packet (DLLP) generator 420 for generating DLLP information for the packet. The DLLP information can be augmented to a TLP by a mux/merge 422. The output of the TX retry buffer can be muxed with the output of mux 412 by a mux 414. The output of mux 414 can be mux/merged with either all zeros 418, which can be used for error checking as described later, or with the product of the DLLP generator 420.

The protocol stack 400 can also include a cyclic redundancy check (CRC) code generator 424 that can generate CRC for the outbound Flit. The CRC code can be mux/ merged 426 with the outbound Flit. A forward error correction (FEC) generator 428 can add error correcting code (ECC) as described above. ECC can be interleaved across each lane of the Flit using three groups of ECC.

An ordered set (OS) generator 430 can provide ordered sets as Flit payload. For example, the OS generator 430 can provide SKiP (SKP) OS into the Flit stream. SKP OS can be used to indicate that a next Flit is an all-zero Flit, as described more below.

The Flits can be transmitted out of the PHY output 434, which can include an analog front end (AFE), scrambling operations, serialization, etc.

In some embodiments, the protocol stack 400 can include margin control and status registers 470. Margin control and status registers 470 can be used for lane margining to characterize the lanes of the link. Specifically, lane margining provides electrical margin information about each lane of the link. The electrical margin information can provide users, testers, and developers (and others) with data to understand performance variation tolerance in the system.

The margin control and status registers 470 can store margin information and other information about the lanes and about the system in general. The margin control and status registers 470 can also be used to activate and deactivate test modes (e.g., system software can write to the margin control and status registers 470 to activate test mode or to cause one or more error logs or counters to be cleared, which can terminate a test).

In some embodiments, the margin control and status registers are CPU registers. The margin control and status register can also be in retimers.

FIG. 4B illustrates a logic circuitry of a protocol stack 440 of a receiver side of the microarchitecture. A Flit can be received by a receiver port's PHY input 442. The PHY input 442 can include an AFE, descrambling operations, and other operations found in the PHY input. The Flit can be demuxed by demux 444 for being an OS Flit by OS check 446 or a payload Flit. The payload Flit can undergo error detection by FEC logic 448 that uses the ECC to identify and correct errors within the Flit. The outcome of error detection can be logged in error log 452, as described in more detail below. The Flit can also undergo CRC checks by CRC/SeqNo check logic 450. The CRC check logic 450 can detect errors at log errors as described below using functions found in error check logic 456. The error check logic 456 can also use stored information in the RX replay buffer 454, if present, to identify bit locations of uncorrectable errors. The Flit is split by demerge 460, and an ACK/NACK is provided to TX retry buffer 416 by the DLLP processor 438. The TLP processor 458 can send the payload to the transaction layer queues 408b.

In some embodiments error check logic 456 can also provide a bit error rate (BER) based on the errors received by one or more counters 472 and based on the number of bits received as determined by the Flit counter and the errors reported by the FEC Correct logic 448 feeding into CRC/SeqNo check logic 450. In PCIe, as in other interconnects such as CXL, UPI, etc., Flits contain a fixed number of bits, which means that a total number of bits can be determined by counting the number of Flits received. The errors can be compared against the total number of bits to compute a BER.

Figure 5:
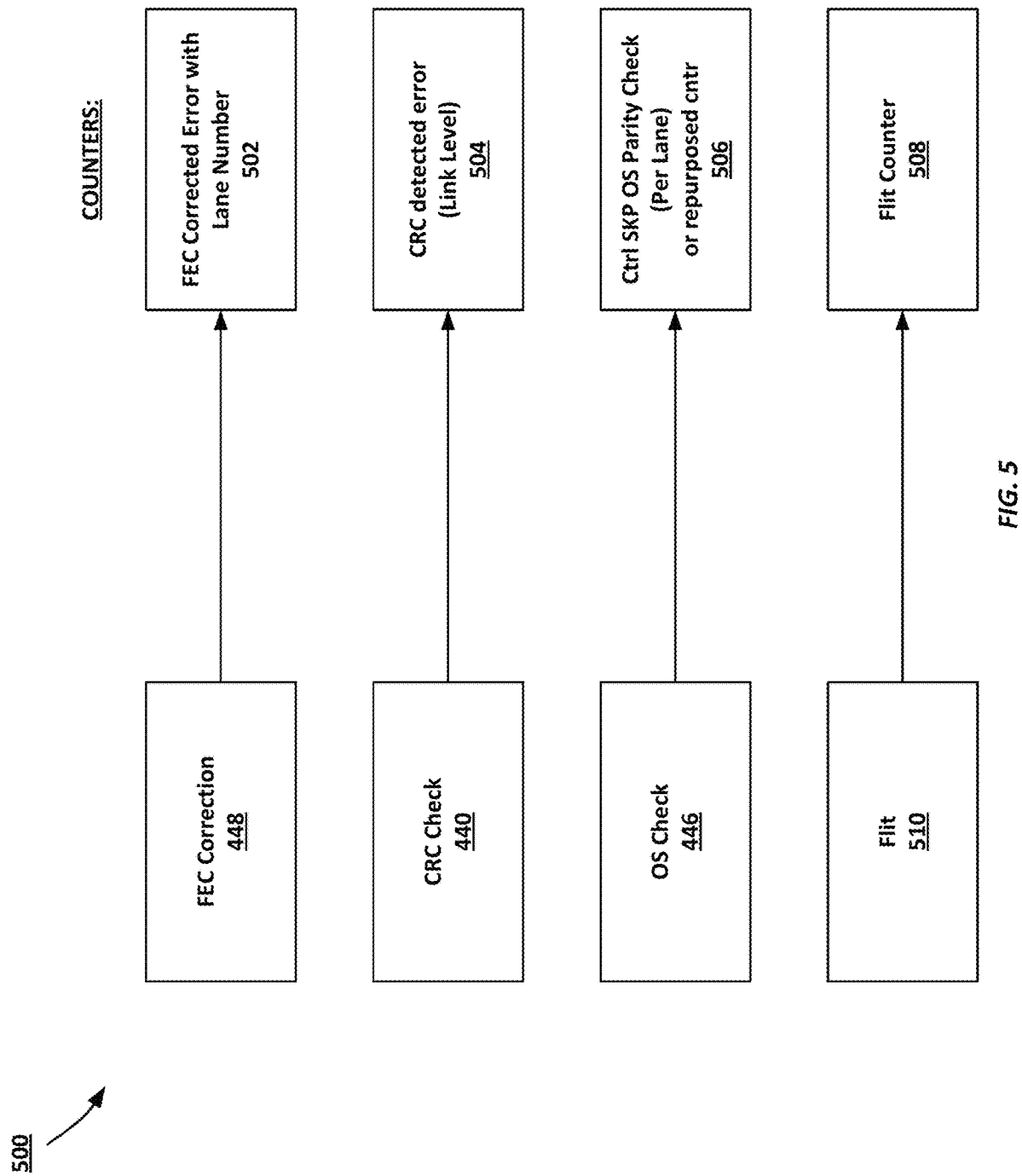
FIG. 5 is a schematic diagram illustrating various example counters for counting errors in accordance with embodiments of the present disclosure.

In embodiments, the protocol stack 440 can include one or more counters 472 for counting Flit errors as they are detected by the receiver. FIG. 5 is a schematic diagram 500 illustrating various example counters for counting errors in accordance with embodiments of the present disclosure. As an example, a protocol stack can include a receiver side that includes certain circuitry for error checking and logging. For example, a protocol stack receiver side can include FEC correction circuitry 448 that can use error correcting code (ECC) to correct errors in a received Flit or data block. If a correctable error is detected and corrected using ECC, then a corresponding per-lane counter 502 can be incremented. The CRC check circuitry 450 can indicate that an uncorrectable error was detected in a received Flit or data block. When an uncorrectable error is detected, a corresponding CRC detected error counter 504 can be incremented. The CRC detected error counter 504 can be used for the whole link, as opposed to per-lane.

The ordered set (OS) check circuitry 446 can cause a Ctrl SKP OS parity check counter 506 to increment. The OS parity check counter 506 can be a dedicated counter that is used to check per-lane errors in the ordered sets (e.g., errors in Ctrl SKP OS). In some embodiments, the per-lane counter 502 can be repurposed for counter OS errors.

As Flits are received into the PHY, a Flit counter 508 can count the number of incoming Flits 510, so a comparison between the number of errors and the number of Flits can be created.

Direct BER Measurement

Direct BER measurements are supported from the observation in Table 1 that the dwell times with a high FBER such as $10^{-6}$ can support direct measurement of the error rate.

TABLE 1

Dwell Times for PCIe 6 for Various FBER Rates

| | PCIe 6 |
|---|---|
| Bit Rate [GB/s] | 64 |
| PAM | 4 |
| Baud Rate [GB/s] | 32 |
| Raw BER Target | 1.00e−6 (FBER) |
| Dwell time to FBER 1e−6 (sec) | 94e−6 |
| Dwell time to FBER 1e−8 (sec) | 9.4e−3 |
| Dwell time to FBER 1e−9 (sec) | 94e−3 |
| Dwell time to FBER 1e−10 (sec) | .94 |
| Dwell time to FBER 1e−11 (sec) | 9.4 |

The direct BER measurement can include the following:
1. 16-Bit Per-Lane Correctable Bit Error Counters Per lane counters (e.g., per-lane counter 502) increment on the ECC Decoder correction of a Symbol. For example, FEC correction circuitry 448 can correct symbols in received Flits using error correcting code (ECC). The per-lane counters 502 are configurable to count raw errors (e.g., all errors corrected in the Flit by the ECC). In some embodiments, the per-lane counter 502 counts a first error based on a Flit boundary. Other example ways of counting correctable errors can be used.

In embodiments, counters increment if the CRC Check passes, which means there are no uncorrectable errors in the Flit.

In some embodiments, the per-lane counters 502 can be repurposed to count errors on parity mismatches on Control SKP OS boundary through a per-Port control register bit.

16-Bit Per Port Uncorrectable Flit Error Counter

In some embodiments, an uncorrectable error counter 504 can be incremented on the detected of a per-port or per-link uncorrectable error. Per-port or per-link counters 504 increment on a CRC Check failure (Flit Retry). The per-port or per link counter 504 is configurable to count raw errors or first error based on a Flit boundary (only count the first Flit in error when consecutive Flits are in error).

32-Bit Flit Transaction Counter

The purpose of the Flit counter 508 is to track the number of bits transacted across the link. The Flit counter 508 increments based on the receiving of a new Flit 510. The Flit counter 508 stops incrementing on all 1s. The Flit counter 508, e.g., does not roll over to continue counting once the counter has reached its maximum value.

For Retimers: 16-Bit Per Lane Error Counters

Retimers can include a subset of the counters and other circuitry as the protocol stack transmitter and receiver sides, shown in FIGS. 4A-B. The retimer portions germane to this disclosure are labeled as A-F.

In some embodiments, a retimer can include an OS counter, such as OS counter 506, can count raw per-lane errors on the skip OS boundary using parity mismatch. With retimers, the BER on the link is measured in each direction at the ports with the ability to find the errors seen by each retimer. Each port and the retimer(s) will report the number of errors based on parity error detection through the control SKP OS. Even though error propagates through subsequent segments in an error, a mismatch in error count in segments implies all segments have independently seen an error.

Retimer counters can be cleared atomically based on a margin command. Enhancement to margining commands to allow access to retimer registers. The ability to broadcast/individually send Margin Commands to the retimers to start, stop and clear all counters in an atomic manner can be done using encoding such as that shown in Table 2.

In general, and pertaining to retimers and the host/device protocol stack implementations, the ability to start, stop, and clear all counters in an atomic manner in the port can be done using margin commands.

TABLE 1

Enhancing Margin Command Related Fields in the Control SKP Ordered Set for Link Characterization and Margining

| Symbol | Description where the 'Usage Model' is 'Lane Margining at Receiver' |
|---|---|
| 4*N + 2 | Bit 6: Usage Model = 0b<br>(0b: Lane Margining at Receiver, 1b: Reserved)<br>[Software writes a 0b to this bit to get the test mechanism started]<br>Bits [5:3]: Margin Type = 111b (IDLE Flit injection test mode in effect till next Control SKP OS)<br>[Software writes 111b to this field to get the test mechanism started]<br>When 'Margin Type' = 111b:<br>Bit [2]: Transmitter will send all IDLE Flits from next Data Block onwards till the next Control SKP OS when 1b; else it will send Data Blocks (including IDLE Flits) till the next Control SKP OS and Retimers stall capturing new Flit Errors<br>Bit [1]: First Retimer has errors to report which will be reflected in 4N + 3<br>Bit [0]: Second Retimer has errors to report which will be reflected in 4N + 3 if Bit [1] is 0b<br>[These 3 bits in the control register will be set to 100b by software if it initiates the 'Correlated error detection' in Margin Type field] |
| 4*N + 3 | Bits [7:0]: Margin Payload (used by Retimer when in 'IDLE Flit injection mode' and IDLE Flits were transmitted since the last Control SKP OS (Bit 2 if Symbol 4N + 2 was 1b)<br>The Port normally sets this field to 00h. If the Port sets this field of FFh, it indicates to the Retimers (in a broadcast manner) to clear their error logs and start the error count and error location from all 0s. An FFh can not be overwritten by Retimers.<br>The first Retimer takes precedence in reporting its error, the second Retimer updates this field if this field is still all 0s.<br>Bits [7:0] = {Flit number of the first Flit in error (i.e., non-0 bit) in the same direction} >> x (where x = 2 if SKP insertion interval >511, x = 1 if SKP insertion interval >255, x = 0 otherwise)<br>[The above represents the most-significant bits if the SKP insertion interval is larger than the 8 bits allotted. The SKP insertion interval is pre-determined depending on SRIS vs non-SRIS (SRNS or common) clocking mode, the data rate, and the width of the Link.]<br>[Details of the error logs to be maintained by the Retimer (which can be read by CSR accesses) are: number of bit errors [15:0], first error reported by the Retimer (Flit Offset not reported [1:0], First Bit in error within the first Flit in error [11:0]-these are cleared on the standard clear error log broadcast command for Margining)<br>For the Control Register: this field indicates the number of micro-seconds the Port should hold off on transaction(s) and ten times the number of micro-seconds the Port should hold off on scheduled DLLP(s) before scheduling them to start on the next Flit after the SKP OS (which should indicate that the 0s in Flits will not be sent). |

FIG. 6 is a process flow diagram 600 for incrementing counters in a receiver in accordance with embodiments of the present disclosure. At the outset, a Flit can be received at a port of a receiving device, such as an endpoint device or a host device, (602). If the FEC mechanisms in the receiver correct an error in the Flit (e.g., using ECC) (604), and the CRC check passes (e.g., no uncorrectable errors) (606), then the per-lane counter to count correctable errors can be incremented for the counter corresponding to the lane on which the error occurred (608). If the CRC check does not pass (606), then the link-based counter to count uncorrectable errors can be incremented (610). In embodiments, the per-lane counter to count correctable errors is incremented if CRC check passes.

If the FEC mechanisms do not detect an error (or correct an error) (604), a CRC check is performed (612). If CRC check passes, then the Flit can be consumed by higher layer circuitry (614). If the Flit does not pass CRC check, then the link-based counter to count uncorrectable errors can be incremented (610).

The Flit counter can be incremented to count the number of Flits or the number of bits received (616).

Figure 6B:
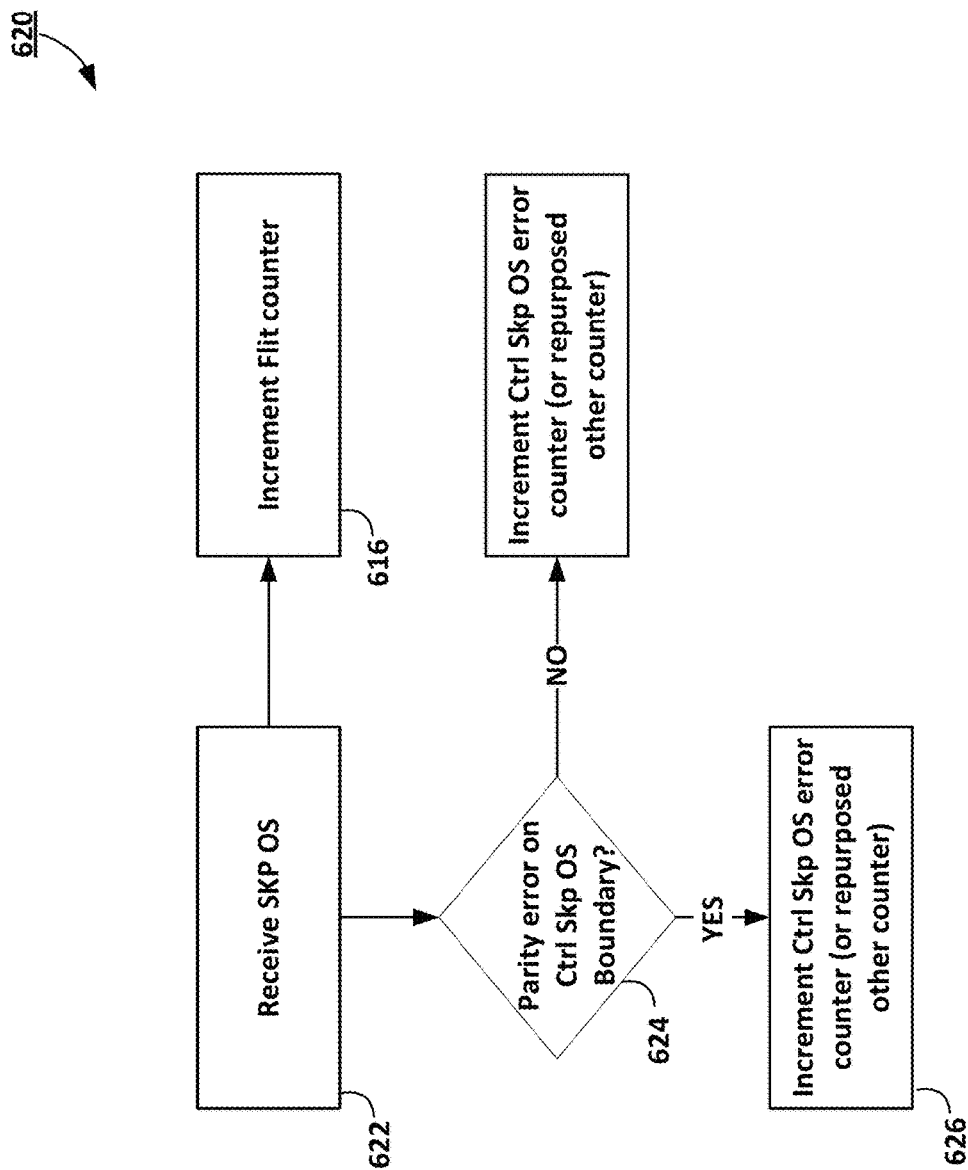
FIG. 6B is a process flow diagram for incrementing a counter based on a parity error check for SKiP Ordered Sets in accordance with embodiments of the present disclosure.

FIG. 6B is a process flow diagram 620 for incrementing a counter based on a parity error check for SKiP Ordered Sets in accordance with embodiments of the present disclosure. In some embodiments, the SKP OS parity check can detect a parity check error (622). If a parity check error is detected at the SKP OS boundary, then a per-lane counter for SKP OS (or a repurposed per-lane counter) can be incremented (e.g., the counter for the lane the error occurred) (614). If no OS parity errors are detected, then the per-lane correctable error check can be considered (604).

The Flit counter can be incremented to count the number of Flits or the number of bits received (616).

Jitter Measurement with PAM-4

In principle, one can just use a pseudorandom binary sequence (PRBS) pattern to measure jitter, provided the channel effect can be removed with some de-embedding method. In practice, it has been difficult to achieve accuracy using a PRBS pattern. That was why a clock pattern is used in non-return-to-zero (NRZ) encoding to measure jitter.

Figure 7:
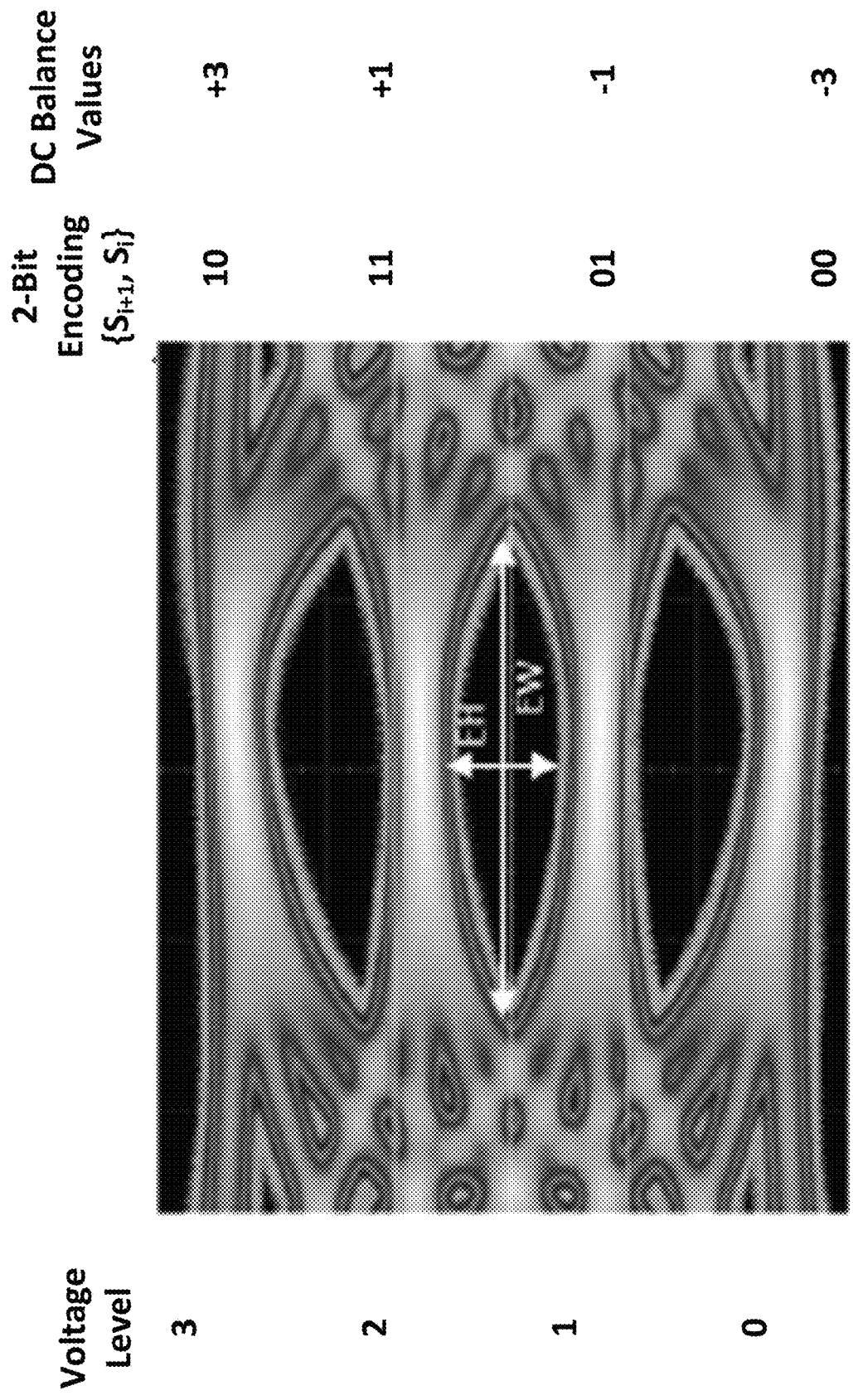
FIG. 7 is a schematic diagram illustrating example PAM-4 voltage levels, encoding, and DC0-balance values for jitter signal generation in accordance with embodiments of the present disclosure.

Clock-like patterns in PAM-4 are challenging to optimize, however. Patterns such as such as 0-1, 2-3, 0-3 are not DC balanced. The 2-bit encoding notation and DC balance values shown in FIG. 7. FIG. 7 is a schematic diagram 700 illustrating example PAM-4 voltage levels, encoding, and DC0-balance values for jitter signal generation in accordance with embodiments of the present disclosure. The diagram 700 can be an eye diagram illustrating voltage levels from 0-3, 2-bit encoding from 00, 01, 11, and 10, and DC balance values from −3-+3.

The jitter insertion approach is summarized below:

The 0-3 clock pattern will be used as the (NRZ) jitter pattern.

For PAM-4 encoding, a jitter pattern is defined as repeating sequence of 021302310132012303120321. This is the shortest sequence that covers all 12 transition edges (rise/fall) with equal probability and is DC balanced. The pattern is 24 UI, or 48 bits long. So over 3 blocks (1 block is 128 bits) it will repeat 8 times or another number of times, depending on implementation choices.

For the compliance pattern settings, the jitter pattern can be combined with a scrambled pattern of length 8192 bits and a pattern to correct the DC balance in the scrambled pattern. This way PAM-4 jitter is covered with both jitter pattern and compliance pattern cross-talk conditions.

Figure 8:
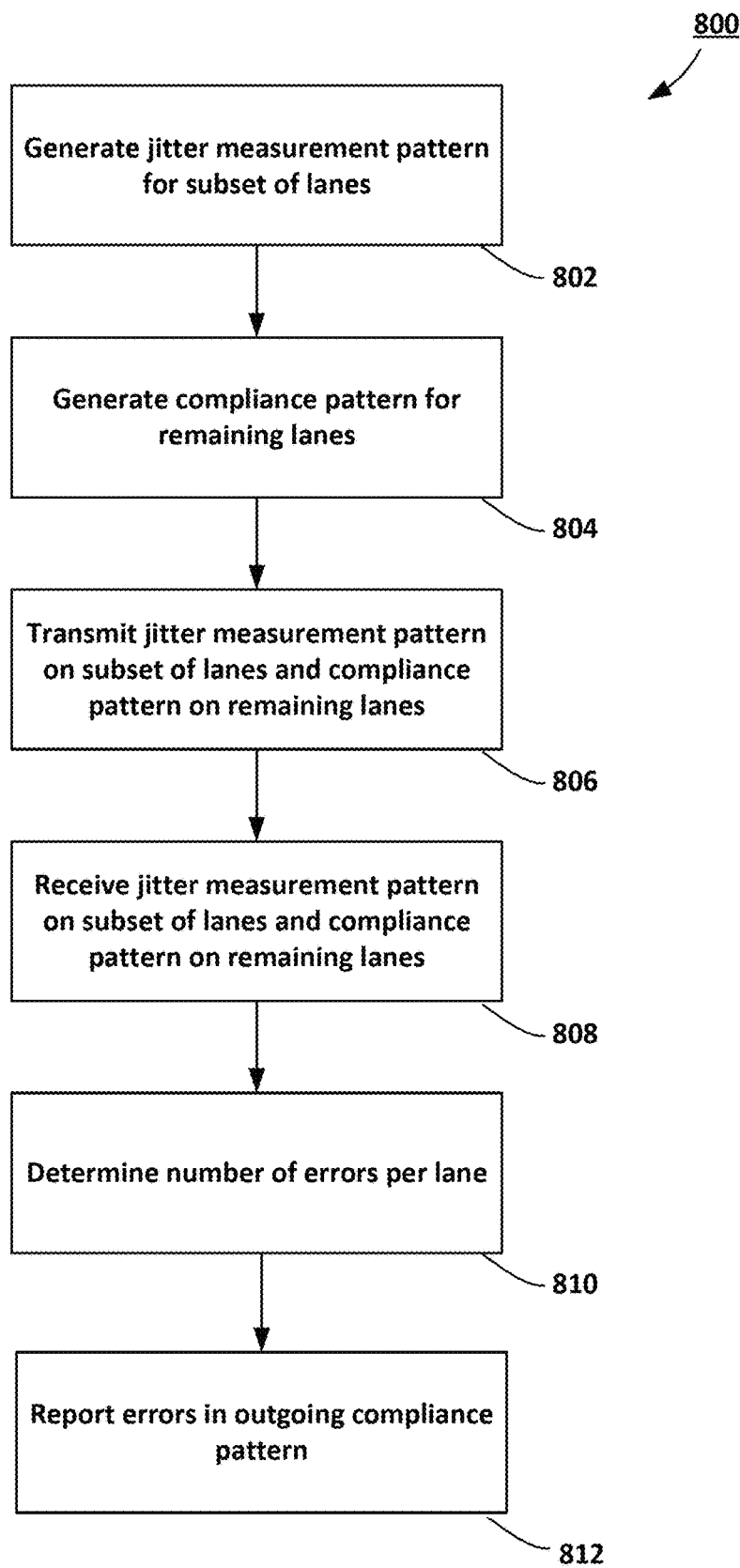
FIG. 8 is a process flow diagram at a transmitter and receiver for inserting and processing jitter in a Flit in accordance with embodiments of the present disclosure.

FIG. 8 is a process flow diagram 800 at a transmitter and receiver for inserting and processing jitter in a Flit in accordance with embodiments of the present disclosure. In embodiments, a PAM-4 encoding can be used, and a jitter patter can include a repeating sequence of 021302310132012303120321.

At a transmitted, a jitter measurement pattern can be generated by transmitter-side circuitry for a subset of lanes of the link (802). A compliance pattern can be generated by transmitter-side circuitry for the remaining lanes (e.g., the total lanes minus the subset of lanes that will carry the jitter measurement pattern) (804). The transmitter can then transmit the jitter measurement pattern on the subset of lanes and can transmit the compliance pattern on the remaining lanes of the link to the receiver (806).

The receiver can receive the jitter measurement pattern on the subset of lanes and the compliance pattern on the remaining lanes (808). The receiver-side circuitry can determine a number of errors per lane based on the received jitter measurement pattern and, in some embodiments, on the received compliance pattern (810). The receiver can report the errors in an outgoing compliance pattern (812).

Test Mode with a Predictable Pattern

The existing loopback mechanism, which will be preserved in PAM-4 with PCIe 6.0, works well where a controller can check that it receives the bits it transmitted, after accounting for the SKP insertion/deletion that may occur at up to 6 Receivers, as shown in FIGS. 2A-B, including the Retimers. This mechanism allows the controller to send any Data Block pattern. The only drawback is in an error it does not indicate which link segment/receiver first saw the errors.

The Flit Mode with an IDLE Flit (where all the TLP and DLLP Bytes are 0's and a valid encoding which results in the CRC Bytes being 0s and the FEC Bytes being 0 prior to scrambling) offers a way to test. This disclosure is as follows using the mechanism in Table 2:

Each Receiver, when in this mode, compares each incoming Symbol in the Data Stream after unscrambling (without any FEC or CRC calculation) to 00h. Any mismatch is a bit in error and is logged.

Software can write to the existing Margin Control Registers in either Port to get the test started. The Port broadcasts the Control SKP Ordered Set with the payload as appropriate.

Each direction in the Link can be tested independently or simultaneously. A variation of the proposal can be to do the IDLE Flit testing on the next Data Stream (i.e., re-entry to L0 through Recovery) and can be stopped on the subsequent Data Stream (i.e., next re-entry to L0 through Recovery). This can be controlled by writing all 1's to the Margin Payload.

Each Port maintains the details of the first error (the Flit Offset[15:0] and the first bit in first Flit that had an error [11:0]) along with the number of errors[15:0]. In addition, it is required to report the first Flit in error in each Retimer [15:0], as reported in Bits 0 and 1 of Symbol 4N+2. Since the Retimer's reporting of the Flit Offset may not be precise (and no information may be available for the second retimer if it reports its first error concurrent with the first retimer), the Port will report what is reported in Symbol 4N+3.

Each Pseudo-Port regenerates the IDLE Flit when in this mode and IDLE Flits are being sent (Bit 2 of Symbol 4N+2 was 1b in the prior SKP OS) (i.e., error does not propagate through Receivers)

The testing stops with a command such as clear error logs, which can be set atomically by a margin command register setting.

Figure 9:
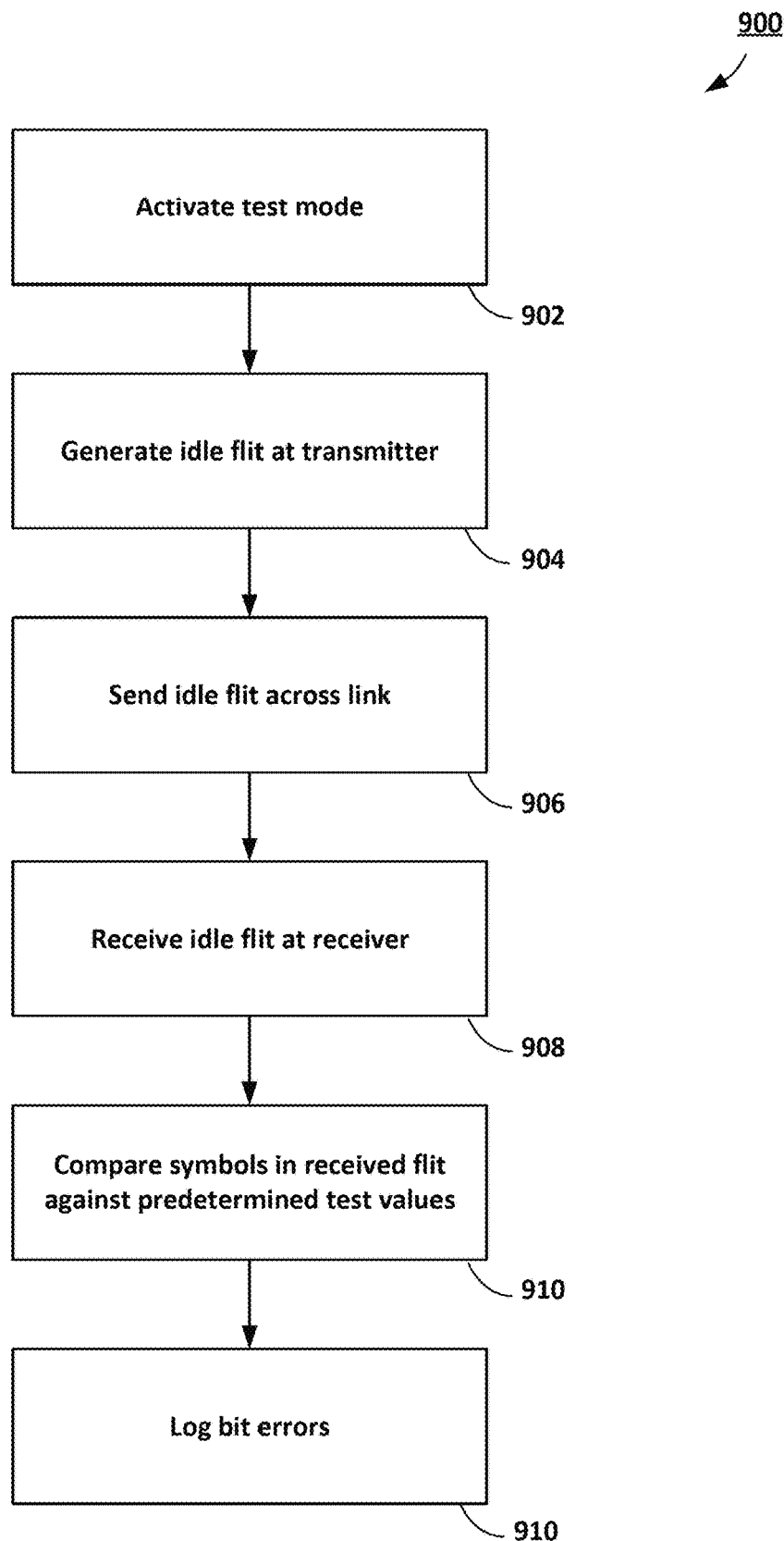
FIG. 9 is a process flow diagram for performing a link test at a receiver in accordance with embodiments of the present disclosure.

FIG. 9 is a process flow diagram 900 for performing a link test at a receiver in accordance with embodiments of the present disclosure. At the outset, software can write to the margin control registers to activate test mode (902). A transmitter can generate an IDLE Flit, where all the TLP and DLLP Bytes are 0's and a valid encoding which results in the CRC Bytes being 0s and the FEC Bytes being 0 prior to scrambling (904), and can transmit the IDLE Flit across the link (906).

The receiver can receive the IDLE Flit from across the link (908). The receiver can compare each incoming Symbol in the Data Stream after unscrambling (without any FEC or CRC calculation) to a predetermined test value (e.g., 00h) (910). Any mismatch is a bit in error and is logged (912).

Figure 10:
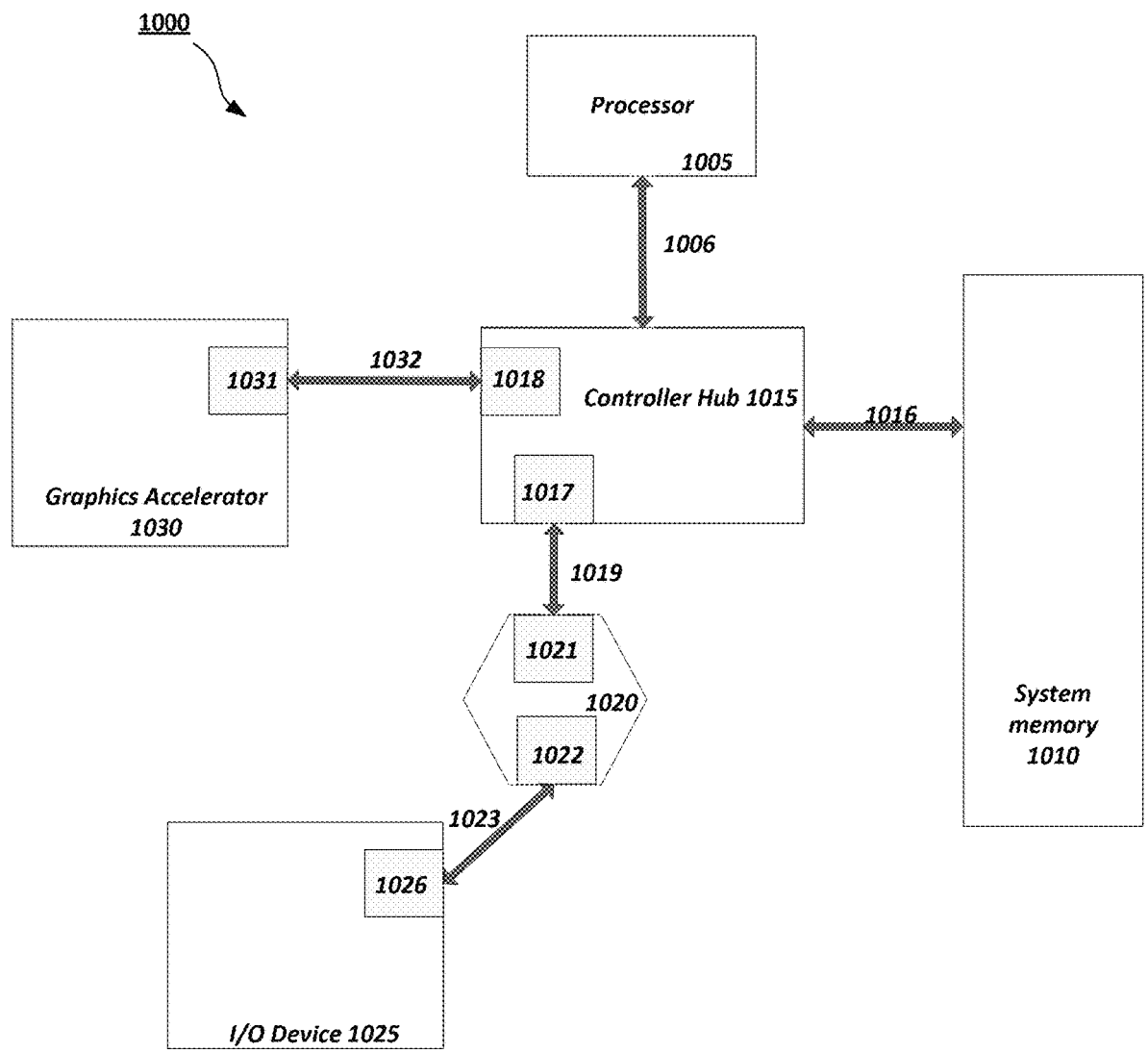
FIG. 10 illustrates an embodiment of a computing system including an interconnect architecture.

Referring to FIG. 10, an embodiment of a fabric composed of point-to-point Links that interconnect a set of components is illustrated. System 1000 includes processor 1005 and system memory 1010 coupled to controller hub 1015. Processor 1005 includes any processing element, such as a microprocessor, a host processor, an embedded processor, a co-processor, or other processor. Processor 1005 is coupled to controller hub 1015 through front-side bus (FSB) 1006. In one embodiment, FSB 1006 is a serial point-to-point interconnect as described below. In another embodiment, link 1006 includes a serial, differential interconnect architecture that is compliant with different interconnect standard.

System memory 1010 includes any memory device, such as random access memory (RAM), non-volatile (NV) memory, or other memory accessible by devices in system 1000. System memory 1010 is coupled to controller hub 1015 through memory interface 1016. Examples of a memory interface include a double-data rate (DDR) memory interface, a dual-channel DDR memory interface, and a dynamic RAM (DRAM) memory interface.

In one embodiment, controller hub 1015 is a root hub, root complex, or root controller in a Peripheral Component Interconnect Express (PCIe or PCIE) interconnection hierarchy. Examples of controller hub 1015 include a chipset, a memory controller hub (MCH), a northbridge, an interconnect controller hub (ICH) a southbridge, and a root port controller/hub. Often the term chipset refers to two physically separate controller hubs, i.e. a memory controller hub (MCH) coupled to an interconnect controller hub (ICH). Note that current systems often include the MCH integrated with processor 1005, while controller 1015 is to communicate with I/O devices, in a similar manner as described below. In some embodiments, peer-to-peer routing is optionally supported through root complex 1015.

Here, controller hub 1015 is coupled to switch/bridge 1020 through serial link 1019. Input/output modules 1017 and 1021, which may also be referred to as interfaces/ports 1017 and 1021, include/implement a layered protocol stack to provide communication between controller hub 1015 and switch 1020. In one embodiment, multiple devices are capable of being coupled to switch 1020.

Switch/bridge 1020 routes packets/messages from device 1025 upstream, i.e. up a hierarchy towards a root complex, to controller hub 1015 and downstream, i.e. down a hierarchy away from a root port controller, from processor 1005 or system memory 1010 to device 1025. Switch 1020, in one embodiment, is referred to as a logical assembly of multiple virtual PCI-to-PCI bridge devices. Device 1025 includes any internal or external device or component to be coupled to an electronic system, such as an I/O device, a Network Interface Controller (NIC), an add-in card, an audio processor, a network processor, a hard-drive, a storage device, a CD/DVD ROM, a monitor, a printer, a mouse, a keyboard, a router, a portable storage device, a Firewire device, a Universal Serial Bus (USB) device, a scanner, and other input/output devices. Often in the PCIe vernacular, such as device, is referred to as an endpoint. Although not specifically shown, device 1025 may include a PCIe to PCI/PCI-X bridge to support legacy or other version PCI devices. Endpoint devices in PCIe are often classified as legacy, PCIe, or root complex integrated endpoints.

Graphics accelerator 1030 is also coupled to controller hub 1015 through serial link 1032. In one embodiment, graphics accelerator 1030 is coupled to an MCH, which is coupled to an ICH. Switch 1020, and accordingly I/O device 1025, is then coupled to the ICH. I/O modules 1031 and 1018 are also to implement a layered protocol stack to communicate between graphics accelerator 1030 and controller hub 1015. Similar to the MCH discussion above, a graphics controller or the graphics accelerator 1030 itself may be integrated in processor 1005.

Figure 11:
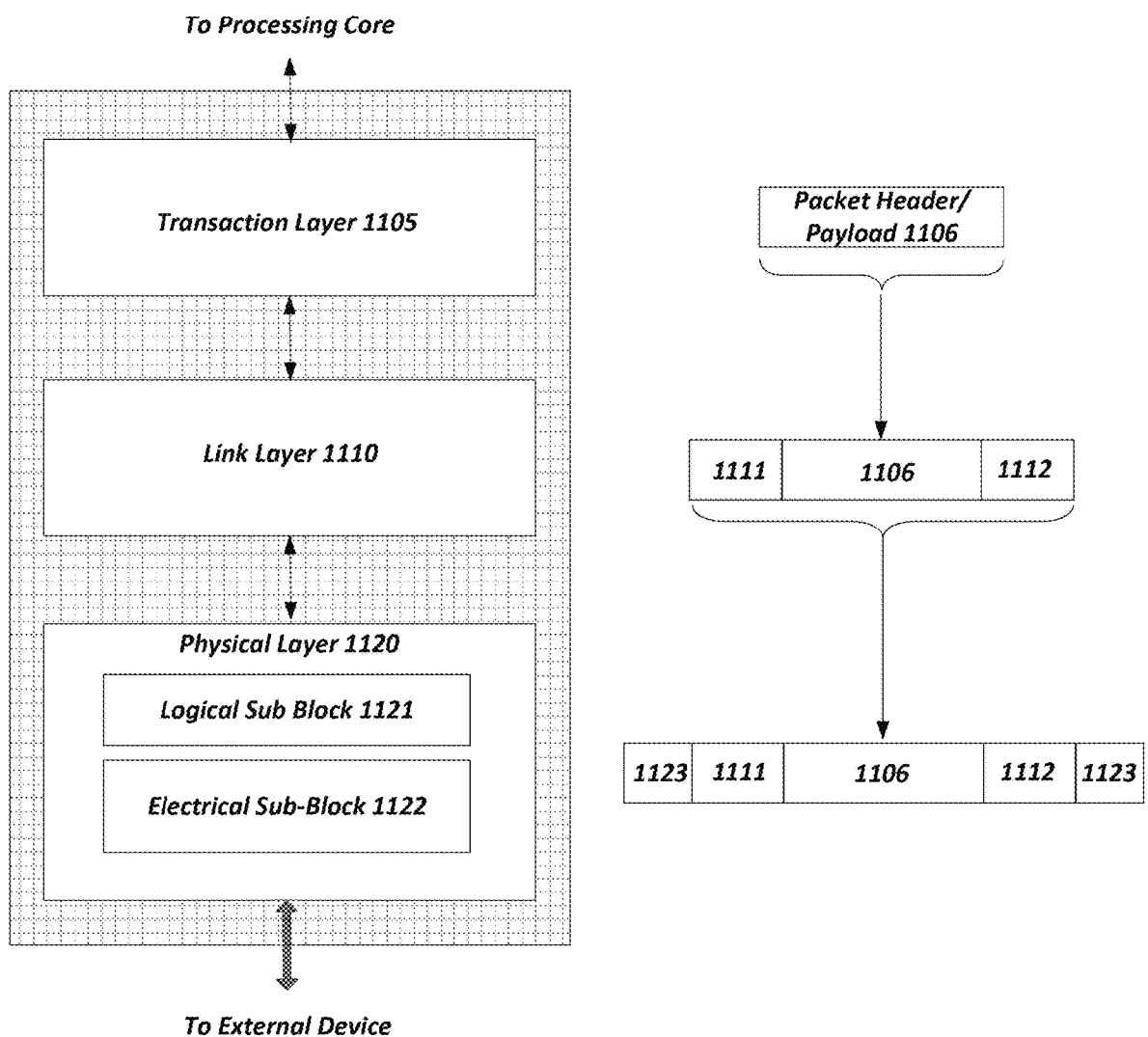
FIG. 11 illustrates an embodiment of an interconnect architecture including a layered stack.

Turning to FIG. 11 an embodiment of a layered protocol stack is illustrated. Layered protocol stack 1100 includes any form of a layered communication stack, such as a Quick Path Interconnect (QPI) stack, a PCIe stack, a next generation high performance computing interconnect stack, or other layered stack. Although the discussion immediately below in reference to FIGS. 10-15 are in relation to a PCIe stack, the same concepts may be applied to other interconnect stacks. In one embodiment, protocol stack 1100 is a PCIe protocol stack including transaction layer 1105, link layer 1110, and physical layer 1120. An interface, such as interfaces 1017, 1018, 1021, 1022, 1026, and 1031 in FIG. 10, may be represented as communication protocol stack 1100. Representation as a communication protocol stack may also be referred to as a module or interface implementing/including a protocol stack.

PCI Express uses packets to communicate information between components. Packets are formed in the Transaction Layer 1105 and Data Link Layer 1110 to carry the information from the transmitting component to the receiving component. As the transmitted packets flow through the other layers, they are extended with additional information necessary to handle packets at those layers. At the receiving side the reverse process occurs and packets get transformed from their Physical Layer 1120 representation to the Data Link Layer 1110 representation and finally (for Transaction Layer Packets) to the form that can be processed by the Transaction Layer 705 of the receiving device.

Transaction Layer

In one embodiment, transaction layer 1105 is to provide an interface between a device's processing core and the interconnect architecture, such as data link layer 1110 and physical layer 1120. In this regard, a primary responsibility of the transaction layer 1105 is the assembly and disassembly of packets (i.e., transaction layer packets, or TLPs). The translation layer 1105 typically manages credit-base flow control for TLPs. PCIe implements split transactions, i.e. transactions with request and response separated by time, allowing a link to carry other traffic while the target device gathers data for the response.

In addition PCIe utilizes credit-based flow control. In this scheme, a device advertises an initial amount of credit for each of the receive buffers in Transaction Layer 1105. An external device at the opposite end of the link, such as controller hub 1015 in FIG. 10, counts the number of credits consumed by each TLP. A transaction may be transmitted if the transaction does not exceed a credit limit. Upon receiving a response an amount of credit is restored. An advantage of a credit scheme is that the latency of credit return does not affect performance, provided that the credit limit is not encountered.

In one embodiment, four transaction address spaces include a configuration address space, a memory address space, an input/output address space, and a message address space. Memory space transactions include one or more of read requests and write requests to transfer data to/from a memory-mapped location. In one embodiment, memory space transactions are capable of using two different address formats, e.g., a short address format, such as a 32-bit address, or a long address format, such as 64-bit address. Configuration space transactions are used to access configuration space of the PCIe devices. Transactions to the configuration space include read requests and write requests.

Message space transactions (or, simply messages) are defined to support in-band communication between PCIe agents.

Therefore, in one embodiment, transaction layer 1105 assembles packet header/payload 1106. Format for current packet headers/payloads may be found in the PCIe specification at the PCIe specification website.

Figure 12:
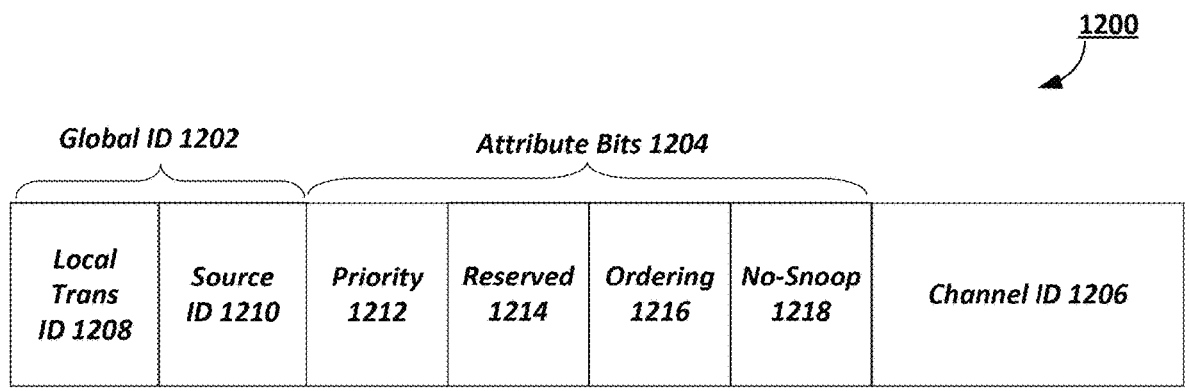
FIG. 12 illustrates an embodiment of a request or packet to be generated or received within an interconnect architecture.

Quickly referring to FIG. 12, an embodiment of a PCIe transaction descriptor is illustrated. In one embodiment, transaction descriptor 1200 is a mechanism for carrying transaction information. In this regard, transaction descriptor 1200 supports identification of transactions in a system. Other potential uses include tracking modifications of default transaction ordering and association of transaction with channels.

Transaction descriptor 1200 includes global identifier field 1202, attributes field 1204, and channel identifier field 1206. In the illustrated example, global identifier field 1202 is depicted comprising local transaction identifier field 1208 and source identifier field 1210. In one embodiment, global transaction identifier 1202 is unique for all outstanding requests.

According to one implementation, local transaction identifier field 1208 is a field generated by a requesting agent, and it is unique for all outstanding requests that require a completion for that requesting agent. Furthermore, in this example, source identifier 1210 uniquely identifies the requestor agent within a PCIe hierarchy. Accordingly, together with source ID 1210, local transaction identifier 1208 field provides global identification of a transaction within a hierarchy domain.

Attributes field 1204 specifies characteristics and relationships of the transaction. In this regard, attributes field 1204 is potentially used to provide additional information that allows modification of the default handling of transactions. In one embodiment, attributes field 1204 includes priority field 1212, reserved field 1214, ordering field 1216, and no-snoop field 1218. Here, priority sub-field 1212 may be modified by an initiator to assign a priority to the transaction. Reserved attribute field 1214 is left reserved for future, or vendor-defined usage. Possible usage models using priority or security attributes may be implemented using the reserved attribute field.

In this example, ordering attribute field 1216 is used to supply optional information conveying the type of ordering that may modify default ordering rules. According to one example implementation, an ordering attribute of "0" denotes default ordering rules are to apply, wherein an ordering attribute of "1" denotes relaxed ordering, wherein writes can pass writes in the same direction, and read completions can pass writes in the same direction. Snoop attribute field 1218 is utilized to determine if transactions are snooped. As shown, channel ID Field 1206 identifies a channel that a transaction is associated with.

Link Layer

Link layer 1110, also referred to as data link layer 1110, acts as an intermediate stage between transaction layer 1105 and the physical layer 1120. In one embodiment, a responsibility of the data link layer 1110 is providing a reliable mechanism for exchanging Transaction Layer Packets (TLPs) between two components a link. One side of the Data Link Layer 1110 accepts TLPs assembled by the Transaction Layer 1105, applies packet sequence identifier 1111, i.e. an identification number or packet number, calculates and applies an error detection code, i.e. CRC 1112, and submits the modified TLPs to the Physical Layer 1120 for transmission across a physical to an external device.

Physical Layer

In one embodiment, physical layer 1120 includes logical sub block 1121 and electrical sub-block 1122 to physically transmit a packet to an external device. Here, logical sub-block 1121 is responsible for the "digital" functions of Physical Layer 1121. In this regard, the logical sub-block includes a transmit section to prepare outgoing information for transmission by physical sub-block 1122, and a receiver section to identify and prepare received information before passing it to the Link Layer 1110.

Physical block 1122 includes a transmitter and a receiver. The transmitter is supplied by logical sub-block 1121 with symbols, which the transmitter serializes and transmits onto to an external device. The receiver is supplied with serialized symbols from an external device and transforms the received signals into a bit-stream. The bit-stream is de-serialized and supplied to logical sub-block 1121. In one embodiment, an 8b/10b transmission code is employed, where ten-bit symbols are transmitted/received. Here, special symbols are used to frame a packet with frames 1123. In addition, in one example, the receiver also provides a symbol clock recovered from the incoming serial stream.

As stated above, although transaction layer 1105, link layer 1110, and physical layer 1120 are discussed in reference to a specific embodiment of a PCIe protocol stack, a layered protocol stack is not so limited. In fact, any layered protocol may be included/implemented. As an example, an port/interface that is represented as a layered protocol includes: (1) a first layer to assemble packets, i.e. a transaction layer; a second layer to sequence packets, i.e. a link layer; and a third layer to transmit the packets, i.e. a physical layer. As a specific example, a common standard interface (CSI) layered protocol is utilized.

Figure 13:
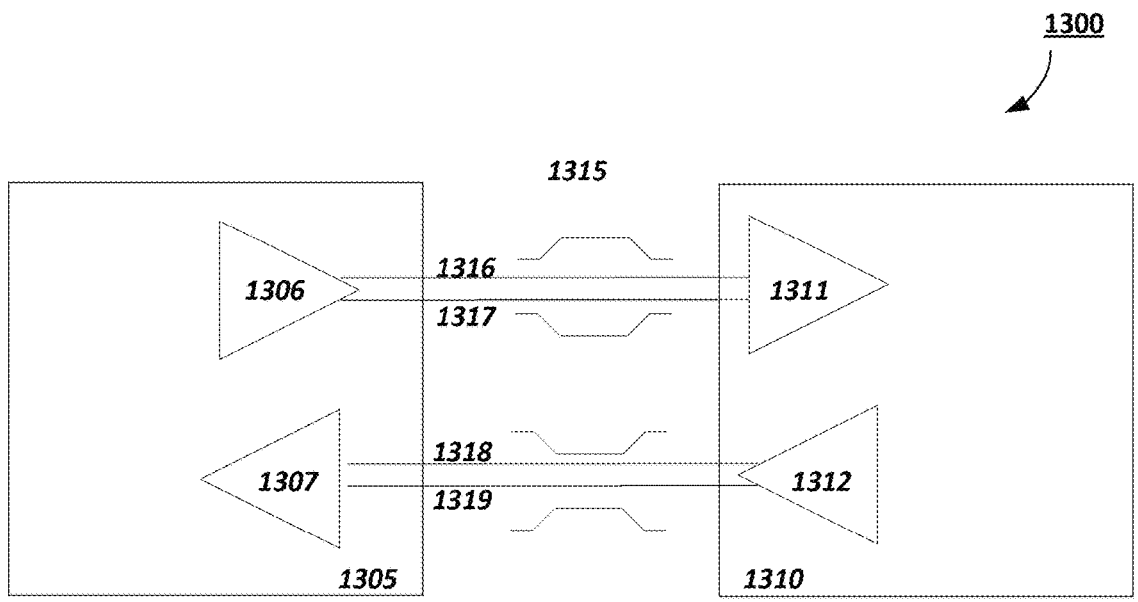
FIG. 13 illustrates an embodiment of a transmitter and receiver pair for an interconnect architecture.

Referring next to FIG. 13, an embodiment of a PCIe serial point to point fabric is illustrated. Although an embodiment of a PCIe serial point-to-point link is illustrated, a serial point-to-point link is not so limited, as it includes any transmission path for transmitting serial data. In the embodiment shown, a basic PCIe link includes two, low-voltage, differentially driven signal pairs: a transmit pair 1306/1311 and a receive pair 1312/1307. Accordingly, device 1305 includes transmission logic 1306 to transmit data to device 1310 and receiving logic 1307 to receive data from device 1310. In other words, two transmitting paths, i.e. paths 1316 and 1317, and two receiving paths, i.e. paths 1318 and 1319, are included in a PCIe link.

A transmission path refers to any path for transmitting data, such as a transmission line, a copper line, an optical line, a wireless communication channel, an infrared communication link, or other communication path. A connection between two devices, such as device 1305 and device 1310, is referred to as a link, such as link 1315. A link may support one lane—each lane representing a set of differential signal pairs (one pair for transmission, one pair for reception). To scale bandwidth, a link may aggregate multiple lanes denoted by xN, where N is any supported Link width, such as 1, 2, 4, 8, 12, 16, 32, 64, or wider.

A differential pair refers to two transmission paths, such as lines 1316 and 1317, to transmit differential signals. As an example, when line 1316 toggles from a low voltage level to a high voltage level, i.e. a rising edge, line 1317 drives from a high logic level to a low logic level, i.e. a falling edge. Differential signals potentially demonstrate better electrical characteristics, such as better signal integrity, i.e. cross-coupling, voltage overshoot/undershoot, ringing, etc. This allows for better timing window, which enables faster transmission frequencies.

Note that the apparatus, methods, and systems described above may be implemented in any electronic device or system as aforementioned. As specific illustrations, the figures below provide exemplary systems for utilizing the disclosure as described herein. As the systems below are described in more detail, a number of different interconnects are disclosed, described, and revisited from the discussion above. And as is readily apparent, the advances described above may be applied to any of those interconnects, fabrics, or architectures.

Figure 14:
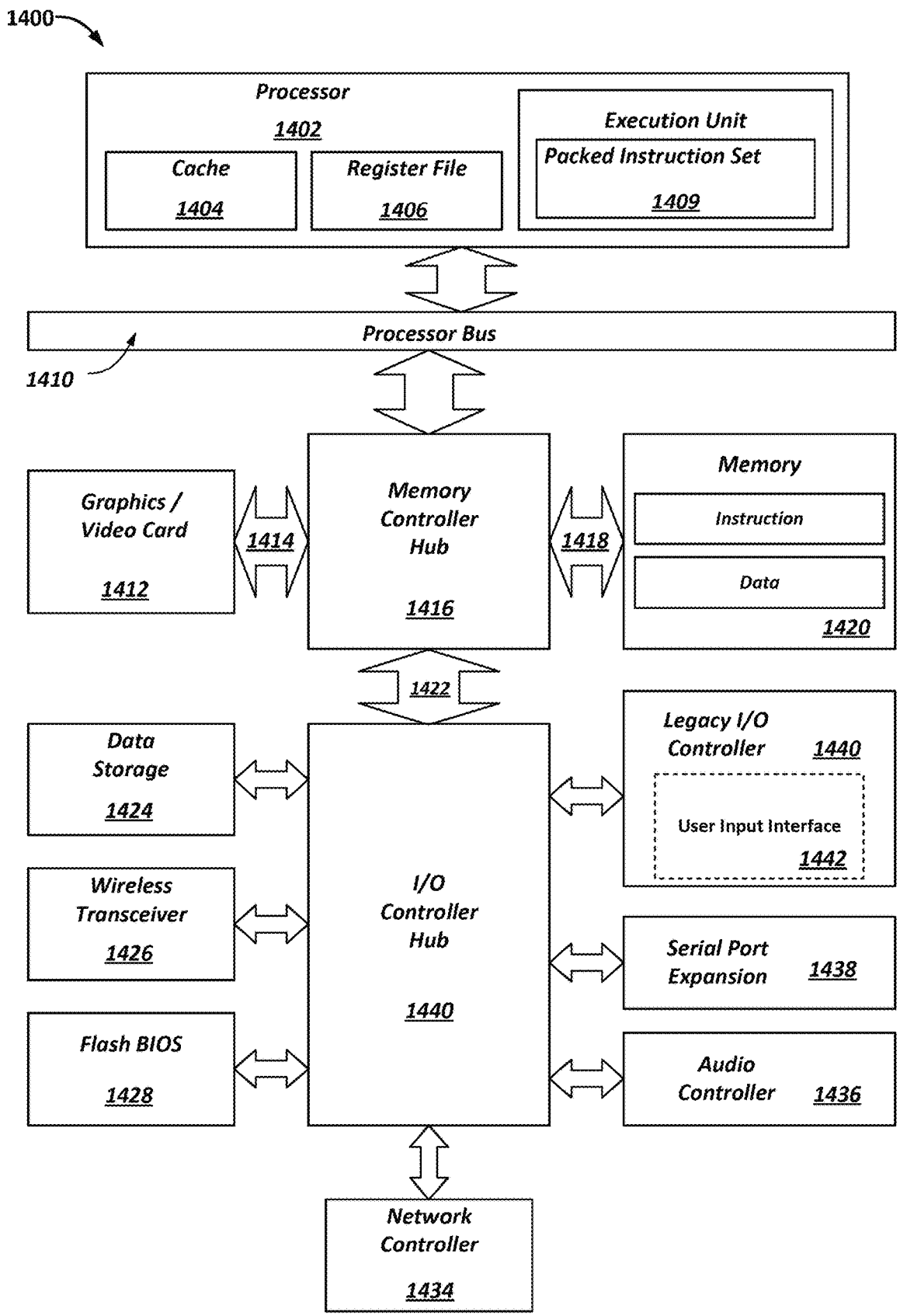
FIG. 14 illustrates another embodiment of a block diagram for a computing system including a processor.

Turning to FIG. 14, a block diagram of an exemplary computer system formed with a processor that includes execution units to execute an instruction, where one or more of the interconnects implement one or more features in accordance with one embodiment of the present disclosure is illustrated. System 1400 includes a component, such as a processor 1402 to employ execution units including logic to perform algorithms for process data, in accordance with the present disclosure, such as in the embodiment described herein. System 1400 is representative of processing systems based on the PENTIUM III™, PENTIUM 4™, Xeon™, Itanium, XScale™ and/or StrongARM™ microprocessors available from Intel Corporation of Santa Clara, California, although other systems (including PCs having other microprocessors, engineering workstations, set-top boxes and the like) may also be used. In one embodiment, sample system 1000 executes a version of the WINDOWS™ operating system available from Microsoft Corporation of Redmond, Washington, although other operating systems (UNIX and Linux for example), embedded software, and/or graphical user interfaces, may also be used. Thus, embodiments of the present disclosure are not limited to any specific combination of hardware circuitry and software.

Embodiments are not limited to computer systems. Alternative embodiments of the present disclosure can be used in other devices such as handheld devices and embedded applications. Some examples of handheld devices include cellular phones, Internet Protocol devices, digital cameras, personal digital assistants (PDAs), and handheld PCs. Embedded applications can include a micro controller, a digital signal processor (DSP), system on a chip, network computers (NetPC), set-top boxes, network hubs, wide area network (WAN) switches, or any other system that can perform one or more instructions in accordance with at least one embodiment.

In this illustrated embodiment, processor 1402 includes one or more execution units 1008 to implement an algorithm that is to perform at least one instruction. One embodiment may be described in the context of a single processor desktop or server system, but alternative embodiments may be included in a multiprocessor system. System 1400 is an example of a 'hub' system architecture. The computer system 1400 includes a processor 1402 to process data signals. The processor 1402, as one illustrative example, includes a complex instruction set computer (CISC) microprocessor, a reduced instruction set computing (RISC) microprocessor, a very long instruction word (VLIW) microprocessor, a processor implementing a combination of instruction sets, or any other processor device, such as a digital signal processor, for example. The processor 1402 is coupled to a processor bus 1410 that transmits data signals between the processor 1402 and other components in the system 1400. The elements of system 1400 (e.g. graphics accelerator 1412, memory controller hub 1416, memory 1420, I/O controller hub 1424, wireless transceiver 1426, Flash BIOS 1028, Network controller 1434, Audio controller 1436, Serial expansion port 1438, I/O controller 1440, etc.) perform their conventional functions that are well known to those familiar with the art.

In one embodiment, the processor 1402 includes a Level 1 (L1) internal cache memory 1404. Depending on the architecture, the processor 1402 may have a single internal cache or multiple levels of internal caches. Other embodiments include a combination of both internal and external caches depending on the particular implementation and needs. Register file 1406 is to store different types of data in various registers including integer registers, floating point registers, vector registers, banked registers, shadow registers, checkpoint registers, status registers, and instruction pointer register.

Execution unit 1408, including logic to perform integer and floating point operations, also resides in the processor 1402. The processor 1402, in one embodiment, includes a microcode (ucode) ROM to store microcode, which when executed, is to perform algorithms for certain macroinstructions or handle complex scenarios. Here, microcode is potentially updateable to handle logic bugs/fixes for processor 1402. For one embodiment, execution unit 1408 includes logic to handle a packed instruction set 1409. By including the packed instruction set 1409 in the instruction set of a general-purpose processor 1402, along with associated circuitry to execute the instructions, the operations used by many multimedia applications may be performed using packed data in a general-purpose processor 1402. Thus, many multimedia applications are accelerated and executed more efficiently by using the full width of a processor's data bus for performing operations on packed data. This potentially eliminates the need to transfer smaller units of data across the processor's data bus to perform one or more operations, one data element at a time.

Alternate embodiments of an execution unit 1408 may also be used in micro controllers, embedded processors, graphics devices, DSPs, and other types of logic circuits. System 1400 includes a memory 1420. Memory 1420 includes a dynamic random access memory (DRAM) device, a static random access memory (SRAM) device, flash memory device, or other memory device. Memory 1420 stores instructions and/or data represented by data signals that are to be executed by the processor 1402.

Note that any of the aforementioned features or aspects of the disclosure may be utilized on one or more interconnect illustrated in FIG. 14. For example, an on-die interconnect (ODI), which is not shown, for coupling internal units of processor 1402 implements one or more aspects of the disclosure described above. Or the disclosure is associated with a processor bus 1410 (e.g. Intel Quick Path Interconnect (QPI) or other known high performance computing interconnect), a high bandwidth memory path 1418 to memory 1420, a point-to-point link to graphics accelerator 1412 (e.g. a Peripheral Component Interconnect express (PCIe) compliant fabric), a controller hub interconnect 1422, an I/O or other interconnect (e.g. USB, PCI, PCIe) for coupling the other illustrated components. Some examples of such components include the audio controller 1436, firmware hub (flash BIOS) 1428, wireless transceiver 1426, data storage 1424, legacy I/O controller 1410 containing user input and keyboard interfaces 1442, a serial expansion port 1438 such as Universal Serial Bus (USB), and a network controller 1434. The data storage device 1424 can comprise a hard disk drive, a floppy disk drive, a CD-ROM device, a flash memory device, or other mass storage device.

Figure 15:
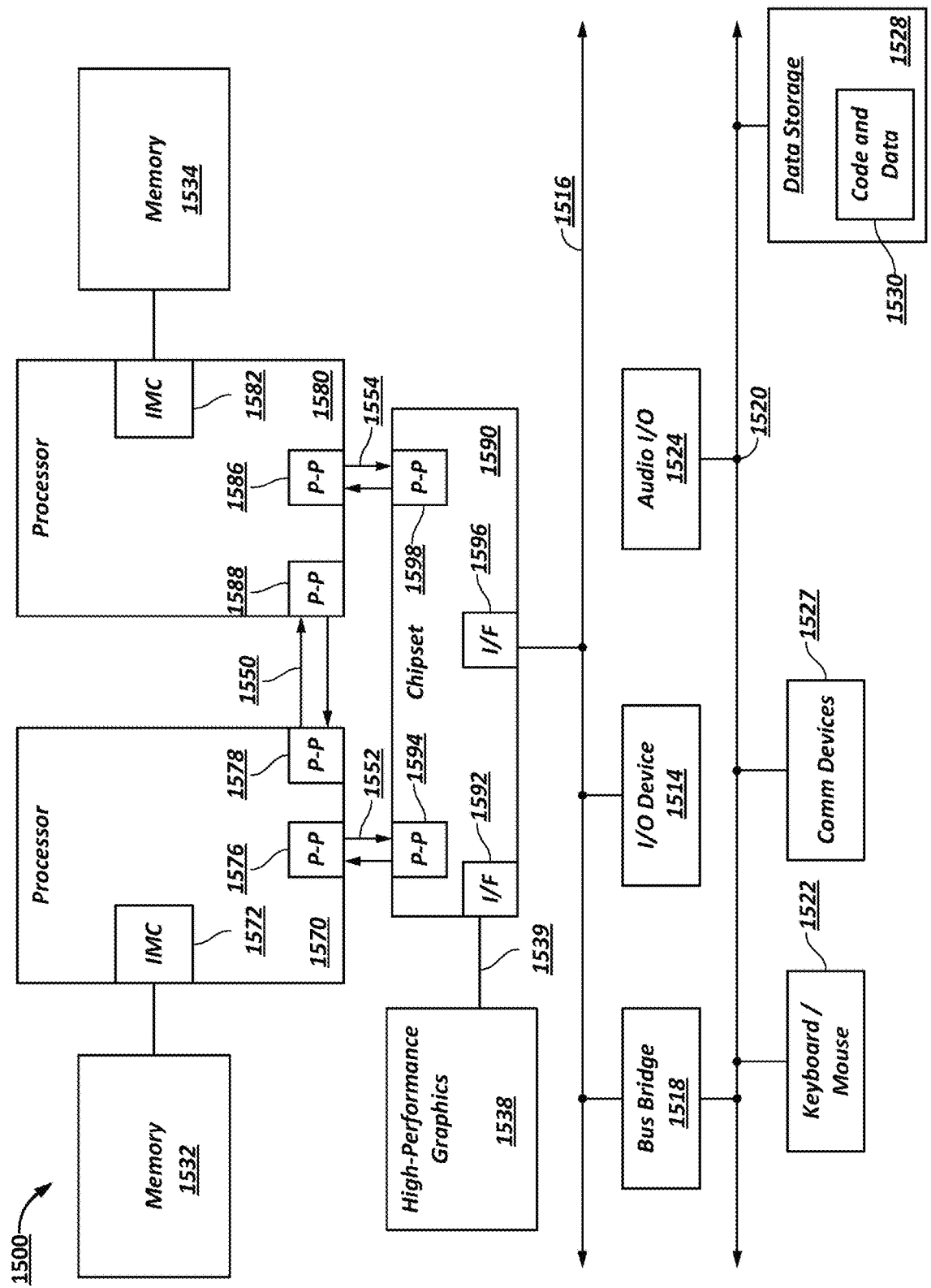
FIG. 15 illustrates an embodiment of a block for a computing system including multiple processor sockets.

Referring now to FIG. 15, shown is a block diagram of a second system 1500 in accordance with an embodiment of the present disclosure. As shown in FIG. 15, multiprocessor system 1500 is a point-to-point interconnect system, and includes a first processor 1570 and a second processor 1580 coupled via a point-to-point interconnect 1550. Each of processors 1570 and 1580 may be some version of a processor. In one embodiment, 1552 and 1554 are part of a serial, point-to-point coherent interconnect fabric, such as Intel's Quick Path Interconnect (QPI) architecture. As a result, the disclosure may be implemented within the QPI architecture.

While shown with only two processors 1570, 1580, it is to be understood that the scope of the present disclosure is not so limited. In other embodiments, one or more additional processors may be present in a given processor.

Processors 1570 and 1580 are shown including integrated memory controller units 1572 and 1582, respectively. Processor 1570 also includes as part of its bus controller units point-to-point (P-P) interfaces 1576 and 1578; similarly, second processor 1580 includes P-P interfaces 1586 and 1588. Processors 1570, 1580 may exchange information via a point-to-point (P-P) interface 1550 using P-P interface circuits 1578, 1588. As shown in FIG. 15, IMCs 1572 and 1582 couple the processors to respective memories, namely a memory 1532 and a memory 1534, which may be portions of main memory locally attached to the respective processors.

Processors 1570, 1580 each exchange information with a chipset 1590 via individual P-P interfaces 1552, 1554 using point to point interface circuits 1576, 1594, 1586, 1598. Chipset 1590 also exchanges information with a high-performance graphics circuit 1438 via an interface circuit 1592 along a high-performance graphics interconnect 1539.

A shared cache (not shown) may be included in either processor or outside of both processors; yet connected with the processors via P-P interconnect, such that either or both processors' local cache information may be stored in the shared cache if a processor is placed into a low power mode.

Chipset 1590 may be coupled to a first bus 1516 via an interface 1596. In one embodiment, first bus 1516 may be a Peripheral Component Interconnect (PCI) bus, or a bus such as a PCI Express bus or another third generation I/O interconnect bus, although the scope of the present disclosure is not so limited.

As shown in FIG. 15, various I/O devices 1514 are coupled to first bus 1516, along with a bus bridge 1518 which couples first bus 1516 to a second bus 1520. In one embodiment, second bus 1520 includes a low pin count (LPC) bus. Various devices are coupled to second bus 1520 including, for example, a keyboard and/or mouse 1522, communication devices 1527 and a storage unit 1528 such as a disk drive or other mass storage device which often includes instructions/code and data 1530, in one embodiment. Further, an audio I/O 1524 is shown coupled to second bus 1520. Note that other architectures are possible, where the included components and interconnect architectures vary. For example, instead of the point-to-point architecture of FIG. 15, a system may implement a multi-drop bus or other such architecture.

Using the various inertial and environmental sensors present in a platform, many different use cases may be realized. These use cases enable advanced computing operations including perceptual computing and also allow for enhancements with regard to power management/battery life, security, and system responsiveness.

For example with regard to power management/battery life issues, based at least on part on information from an ambient light sensor, the ambient light conditions in a location of the platform are determined and intensity of the display controlled accordingly. Thus, power consumed in operating the display is reduced in certain light conditions.

As to security operations, based on context information obtained from the sensors such as location information, it may be determined whether a user is allowed to access certain secure documents. For example, a user may be permitted to access such documents at a work place or a home location. However, the user is prevented from accessing such documents when the platform is present at a public location. This determination, in one embodiment, is based on location information, e.g., determined via a GPS sensor or camera recognition of landmarks. Other security operations may include providing for pairing of devices within a close range of each other, e.g., a portable platform as described herein and a user's desktop computer, mobile telephone or so forth. Certain sharing, in some implementations, are realized via near field communication when these devices are so paired. However, when the devices exceed a certain range, such sharing may be disabled. Furthermore, when pairing a platform as described herein and a smartphone, an alarm may be configured to be triggered when the devices move more than a predetermined distance from each other, when in a public location. In contrast, when these paired devices are in a safe location, e.g., a work place or home location, the devices may exceed this predetermined limit without triggering such alarm.

Responsiveness may also be enhanced using the sensor information. For example, even when a platform is in a low power state, the sensors may still be enabled to run at a relatively low frequency. Accordingly, any changes in a location of the platform, e.g., as determined by inertial sensors, GPS sensor, or so forth is determined. If no such changes have been registered, a faster connection to a previous wireless hub such as a Wi-Fi™ access point or similar wireless enabler occurs, as there is no need to scan for available wireless network resources in this case. Thus, a greater level of responsiveness when waking from a low power state is achieved.

It is to be understood that many other use cases may be enabled using sensor information obtained via the integrated sensors within a platform as described herein, and the above examples are only for purposes of illustration. Using a system as described herein, a perceptual computing system may allow for the addition of alternative input modalities, including gesture recognition, and enable the system to sense user operations and intent.

In some embodiments one or more infrared or other heat sensing elements, or any other element for sensing the presence or movement of a user may be present. Such sensing elements may include multiple different elements working together, working in sequence, or both. For example, sensing elements include elements that provide initial sensing, such as light or sound projection, followed by sensing for gesture detection by, for example, an ultrasonic time of flight camera or a patterned light camera.

Also in some embodiments, the system includes a light generator to produce an illuminated line. In some embodiments, this line provides a visual cue regarding a virtual boundary, namely an imaginary or virtual location in space, where action of the user to pass or break through the virtual boundary or plane is interpreted as an intent to engage with the computing system. In some embodiments, the illuminated line may change colors as the computing system transitions into different states with regard to the user. The illuminated line may be used to provide a visual cue for the user of a virtual boundary in space, and may be used by the system to determine transitions in state of the computer with regard to the user, including determining when the user wishes to engage with the computer.

In some embodiments, the computer senses user position and operates to interpret the movement of a hand of the user through the virtual boundary as a gesture indicating an intention of the user to engage with the computer. In some embodiments, upon the user passing through the virtual line or plane the light generated by the light generator may change, thereby providing visual feedback to the user that the user has entered an area for providing gestures to provide input to the computer.

Display screens may provide visual indications of transitions of state of the computing system with regard to a user. In some embodiments, a first screen is provided in a first state in which the presence of a user is sensed by the system, such as through use of one or more of the sensing elements.

In some implementations, the system acts to sense user identity, such as by facial recognition. Here, transition to a second screen may be provided in a second state, in which the computing system has recognized the user identity, where this second the screen provides visual feedback to the user that the user has transitioned into a new state. Transition to a third screen may occur in a third state in which the user has confirmed recognition of the user.

In some embodiments, the computing system may use a transition mechanism to determine a location of a virtual boundary for a user, where the location of the virtual boundary may vary with user and context. The computing system may generate a light, such as an illuminated line, to indicate the virtual boundary for engaging with the system. In some embodiments, the computing system may be in a waiting state, and the light may be produced in a first color. The computing system may detect whether the user has reached past the virtual boundary, such as by sensing the presence and movement of the user using sensing elements.

In some embodiments, if the user has been detected as having crossed the virtual boundary (such as the hands of the user being closer to the computing system than the virtual boundary line), the computing system may transition to a state for receiving gesture inputs from the user, where a mechanism to indicate the transition may include the light indicating the virtual boundary changing to a second color.

In some embodiments, the computing system may then determine whether gesture movement is detected. If gesture movement is detected, the computing system may proceed with a gesture recognition process, which may include the use of data from a gesture data library, which may reside in memory in the computing device or may be otherwise accessed by the computing device.

If a gesture of the user is recognized, the computing system may perform a function in response to the input, and return to receive additional gestures if the user is within the virtual boundary. In some embodiments, if the gesture is not recognized, the computing system may transition into an error state, where a mechanism to indicate the error state may include the light indicating the virtual boundary changing to a third color, with the system returning to receive additional gestures if the user is within the virtual boundary for engaging with the computing system.

As mentioned above, in other embodiments the system can be configured as a convertible tablet system that can be used in at least two different modes, a tablet mode and a notebook mode. The convertible system may have two panels, namely a display panel and a base panel such that in the tablet mode the two panels are disposed in a stack on top of one another. In the tablet mode, the display panel faces outwardly and may provide touch screen functionality as found in conventional tablets. In the notebook mode, the two panels may be arranged in an open clamshell configuration.

In various embodiments, the accelerometer may be a 3-axis accelerometer having data rates of at least 50 Hz. A gyroscope may also be included, which can be a 3-axis gyroscope. In addition, an e-compass/magnetometer may be present. Also, one or more proximity sensors may be provided (e.g., for lid open to sense when a person is in proximity (or not) to the system and adjust power/performance to extend battery life). For some OS's Sensor Fusion capability including the accelerometer, gyroscope, and compass may provide enhanced features. In addition, via a sensor hub having a real-time clock (RTC), a wake from sensors mechanism may be realized to receive sensor input when a remainder of the system is in a low power state.

In some embodiments, an internal lid/display open switch or sensor to indicate when the lid is closed/open, and can be used to place the system into Connected Standby or automatically wake from Connected Standby state. Other system sensors can include ACPI sensors for internal processor, memory, and skin temperature monitoring to enable changes to processor and system operating states based on sensed parameters.

In an embodiment, the OS may be a Microsoft® Windows® 8 OS that implements Connected Standby (also referred to herein as Win8 CS). Windows 8 Connected Standby or another OS having a similar state can provide, via a platform as described herein, very low ultra idle power to enable applications to remain connected, e.g., to a cloud-based location, at very low power consumption. The platform can supports 3 power states, namely screen on (normal); Connected Standby (as a default "off" state); and shutdown (zero watts of power consumption). Thus in the Connected Standby state, the platform is logically on (at minimal power levels) even though the screen is off. In such a platform, power management can be made to be transparent to applications and maintain constant connectivity, in part due to offload technology to enable the lowest powered component to perform an operation.

In one example, a PCIe physical layer may be utilized to support multiple different protocols. Accordingly, a particular training state in a PCIe LTSSM may be utilized for the negotiation of protocols between devices on a link. As noted above, the protocol determination may occur even before the link trains to an active state (e.g., L0) in the lowest supported data rate (e.g., the PCIe Gen 1 data rate). In one example, the PCIe Config state may be used. Indeed, the PCIe LTSSM may be used to negotiate the protocol by using modified PCIe Training Sets (e.g., TS1 and TS2) after the link width negotiation and (at least partially) in parallel with lane numbering performed during the Config state. A protocol stack can include circuitry to support multiple protocols, such as PCIe and CXL.

While this disclosure has been described with respect to a limited number of embodiments, those skilled in the art will appreciate numerous modifications and variations therefrom. It is intended that the appended claims cover all such modifications and variations as fall within the true spirit and scope of this present disclosure.

A design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase "to" or "configured to," in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

Various aspects and combinations of the embodiments are described above, some of which are represented by the following examples:

Example 1 is an apparatus comprising protocol stack circuitry. The protocol stack circuitry to receive a flow control unit (Flit) header and a transaction layer packet (TLP) payload, the TLP payload comprising a first portion and a second portion, forward the Flit header and the first portion of the TLP payload to a link partner based on the Flit header being free from errors, identify that the Flit contains an error from the second portion of the TLP payload, and send a data link layer packet (DLLP) to the link partner to indicate the error in the TLP payload.

Example 2 may include the subject matter of example 1, the protocol circuitry to perform a forward error correction (FEC) check on the Flit header to determine that the Flit header is free from errors.

Example 3 may include the subject matter of any of examples 1-2, the protocol circuitry to perform a cyclic redundancy check (CRC) on the Flit header to determine that the Flit header is free from errors.

Example 4 may include the subject matter of any of examples 1-3, the protocol circuitry to perform a forward error correction (FEC) check on the TLP payload to identify the error in the second portion of the TLP payload.

Example 5 may include the subject matter of any of examples 1-6, wherein the protocol circuitry to perform a cyclic redundancy check (CRC) check on the TLP payload to identify the error in the second portion of the TLP payload.

Example 6 may include the subject matter of any of examples 1-5, wherein the error in the TLP payload is identified by a late poison bit set in the second portion of the TLP payload.

Example 7 may include the subject matter of any of examples 1-6, wherein the error in the TLP payload is identified by an end data bad bit set in the second portions of the TLP payload.

Example 8 may include the subject matter of any of examples 1-7, wherein the port is to operate in a low-latency mode.

Example 9 may include the subject matter of example 8, wherein the port is to operate using a low-latency late poison mode or low-latency end data bad mode or both.

Example 10 may include the subject matter of any of examples 1-9, the protocol circuitry to populate the second portion of the TLP payload with no operation (NOP) TLPs in response to identifying the error in the TLP payload; and send the NOP TLPs across the link.

Example 11 may include the subject matter of any of examples 1-10, the protocol circuitry to operate in cut-through forwarding mode.

Example 12 may include the subject matter of any of examples 1-11, wherein the DLLP comprises a link management DLLP.

Example 13 may include the subject matter of any of examples 1-12, wherein the error is indicated by one of an end data bad bit in the second portion of the TLP payload or a late poison bit in the second portion of the TLP payload.

Example 14 is a method comprising receiving a Flit header and a transaction layer packet (TLP) payload; determining that the Flit header does not include an error; sending a first portion of the TLP payload to a link partner; determining that the TLP payload contains an error based on an error indication from a second portion of the TLP payload; and sending a link management data link layer packet (DLLP) to the link partner to indicate the error.

Example 15 may include the subject matter of example 14, further comprising populating the second portion of the TLP payload with no operation (NOP) TLPs to indicate the error.

Example 16 may include the subject matter of any of examples 14-16, wherein the second portion of the Flit comprises a last double word of the TLP payload.

Example 17 may include the subject matter of example 16, wherein the last double word of the TLP comprises one of an end data bad indicator or a late poison indicator, the end data bad indicator and late poison indicator to indicate an error in the TLP.

Example 18 may include the subject matter of any of examples 14-17, further comprising determining that the Flit header does not include an error based on a forward error correction and cyclic redundancy check of the Flit header.

Example 19 may include the subject matter of any of examples 14-18, wherein the DLLP comprises a link management type DLLP.

Example 20 is a system comprising an upstream port; a downstream port; and protocol stack circuitry. The protocol circuitry to receive a flow control unit (Flit) comprising a transaction layer packet (TLP) header and a TLP payload, the TLP payload comprising a first portion and a second portion, forward the TLP header and the first portion of the TLP payload to a link partner, and determine whether the TLP header or the TLP payload comprises an error. If the TLP header comprises an error, then set an end data bad (EDB) bit in a link management data link layer packet (DLLP) in the second portion of the TLP payload; and if the TLP payload comprises an error, then set on of an EDB bit or a late poison bit in the link management DLLP; and send the second portion of the TLP payload to the link partner.

Example 21 may include the subject matter of example 20, wherein the system comprises one of a root port, a switch complex, or an endpoint.

Example 22 may include the subject matter of any of examples 20-21, the protocol stack circuitry to encode no operation TLPs into the second portion of the TLP payload.

Example 23 may include the subject matter of any of examples 20-22, the protocol stack comprising physical layer circuitry (PHY) comprising forward error correction circuitry and cyclic redundancy check circuitry, the protocol stack circuitry to determine that the Flit header is free from error based on processing the Flit header using the forward error correction circuitry and the cyclic redundancy check circuitry.

Example 24 may include the subject matter of any of examples 20-23, wherein the protocol stack circuitry is to determine an error in the second portion of the TLP based on end data bad information or late poison information identified in the last double word of the second portion of the TLP.

Example 25 may include the subject matter of any of examples 20-24, wherein the DLLP comprises a link management DLLP.

Example 26 may include the subject matter of example 1, the protocol stack circuitry to determine that the Flit header is free from errors.

Example 27 may include the subject matter of example 1, the protocol stack circuitry to determine that the TLP header comprises the error; and set an end data bad (EDB) bit in the DLLP to indicate the error in the TLP header.

Example 28 may include the subject matter of example 1, the protocol stack circuitry to determine that one of the first portion or the second portion of the TLP comprises the error; and set a late poison bit in the DLLP to indicate the error.

Example 29 may include the subject matter of example 1, the protocol stack circuitry to determine that one of the first portion or the second portion of the TLP comprises the error; and set an EDB bit in the DLLP to indicate the error.

Example 30 may include the subject matter of example 1, the apparatus comprising a root port, the root port comprising the protocol stack circuitry. The apparatus can include a transmitter-side that includes the protocol stack circuitry. The transmitter-side to identify an error, such as a parity error, a ECC error, CRC error, or other error in the TLP header or TLP payload. In some cases, the error in the TLP header can be found after the TLP header is already transmitted (alone or with TLP payload). If an error is found in the TLP header, an EDB bit is set in the link layer DLLP of the last DW of the TLP payload. NOP TLPs can also be sent. If the error is found in the TLP payload (at any time), a late poison bit can be set in the last DW of the payload or an EDB bit can be set, depending on the severity or nature of the error.

What is claimed is:

1. An apparatus comprising:
  a receiver comprising:
    margin control and status registers;
    a port to receive a flow control unit (Flit) across a link, the link comprising a plurality of lanes;
    error detection circuitry to detect an error in the Flit, the error detection circuitry comprising forward error correction (FEC) circuitry,
    an error counter to count a number of errors detected, the error counter to increment based on the error detected in the Flit by the error detection circuitry,
    a Flit counter to count a number of Flits received, the Flit counter to increment based on receiving the Flit, and
    bit error rate logic to determine a bit error rate based on a count recorded by the error counter and a number of bits received as indicated by the Flit counter;
  wherein bits of the margin control and status registers indicate whether a test mode is activated, and the receiver is to log the bit error rate based on the test mode being indicated as activated.

2. The apparatus of claim 1, wherein the FEC circuitry to correct the error in the Flit with error correcting code.

3. The apparatus of claim 2, wherein the error counter is to increment based on the FEC circuitry correcting the error in the Flit.

4. The apparatus of claim 2, wherein the error detection circuitry further comprises cyclic redundancy check (CRC) circuitry, and the error counter to increment based on the FEC circuitry correcting the error in the Flit and the Flit passing a check performed by the CRC circuitry.

5. The apparatus of claim 2, wherein the FEC circuitry is to detect a correctable error in the Flit on a per-lane basis, and wherein the error counter is to count a number of correctable errors on a per-lane basis.

6. The apparatus of claim 1, wherein the error detection circuitry further comprises cyclic redundancy check (CRC) circuitry, the CRC circuitry to detect an uncorrectable error in the Flit, and wherein the error counter comprises an uncorrectable error counter, the uncorrectable error counter to increment based on the Flit comprising an uncorrectable error.

7. The apparatus of claim 1, wherein the error detection circuitry comprises ordered set (OS) parity check circuitry to detect an error in an OS based on a parity mismatch, and wherein the error counter is to count the error detected by the OS parity check circuitry.

8. The apparatus of claim 1, wherein the error counter is to count a first error detected at after a Flit boundary.

9. The apparatus of claim 1, wherein the error counter is to count each error in the Flit.

10. The apparatus of claim 1, further comprising a margin command register, the margin command register comprising margin command information to start, stop, or clear the error counter.

11. A method comprising:
  activating a test mode by setting bits in margin control and status registers of a Peripheral Component Interconnect Express (PCIe)-compatible device;
  receiving, at the PCIe-compatible device, a Flit from a multilane link;
  detecting an error in the Flit by error detection circuitry comprising forward error correction (FEC) circuitry;
  incrementing an error counter based on determining the error and based on a type of error;
  incrementing a Flit counter;
  determining a bit error rate based on an error count recorded by the error counter and a number of bits received recorded by the Flit counter; and
  logging the bit error rate.

12. The method of claim 11, wherein determining an error in the Flit comprises:
  detecting a correctable error by the forward error correction (FEC) circuitry; and
  correcting the correctable error using error correcting code.

13. The method of claim 12, wherein incrementing the error counter comprises incrementing a per-lane correctable error counter based on correcting the correctable error using error correcting code.

14. The method of claim 12, wherein incrementing the error counter comprises incrementing a per-lane correctable error counter based on correcting the correctable error using error correcting code and the Flit passing a cyclic redundancy check.

15. The method of claim 12, further comprising incrementing a per-lane correctable error counter for errors corrected on each lane of the multilane link.

16. The method of claim 11, further comprising:
determining an uncorrectable error in the Flit; and
incrementing the error counter comprises incrementing a per-port uncorrectable error counter based on determining the uncorrectable error in the Flit.

17. The method of claim 11, further comprising:
determining an error in an ordered set at an ordered set boundary based on a parity mismatch;
incrementing the error counter based on determining the error in the ordered set.

18. The method of claim 11, wherein incrementing the error counter comprises incrementing the error counter based on each error detected in the Flit.

19. The method of claim 11, wherein incrementing the error counter comprises incrementing the error counter based on a first error detected in the Flit.

20. The method of claim 11, further comprising setting information in a margin command register to start, stop, or clear the error counter.

21. A system comprising:
a host device comprising a transmitter to transmit a flow control unit (Flit) over a multilane link;
an endpoint device comprising a receiver port to receive the Flit, the receiver port comprising:
margin control and status registers;
forward error correction (FEC) circuitry to detect an error in the Flit,
an error counter to count a number of errors detected, the error counter to increment based on the error detected in the Flit by the FEC circuitry,
a Flit counter to count a number of Flits received, the Flit counter to increment based on receiving the Flit, and
bit error rate logic to determine a bit error rate based on a count recorded by the error counter and a number of bits received as indicated by the Flit counter, wherein the receiver port is to log the bit error rate based on one or more bits of the margin control and status registers indicating a test mode is activated.

22. The system of claim 21, further comprising a retimer coupled by a multilane link downstream of the host device and upstream of the endpoint device, the retimer comprising:
ordered set (OS) error detection circuitry to detect an OS error at a Flit boundary; and
an OS error counter to count a number of OS errors detected, the OS error counter to increment based on an OS error detected at a Flit boundary based on a parity mismatch.

23. The system of claim 22, further comprising a margin command register comprising information to start, stop, or clear the error counter or the OS error counter.

24. The system of claim 21, wherein the FEC circuitry to correct the error in the Flit with error correcting code; and wherein the error counter is to increment based on the FEC circuitry correcting the error in the Flit.

25. The system of claim 24, the receiver port further comprising cyclic redundancy check (CRC) circuitry, the error counter to increment based on the FEC circuitry correcting the error in the Flit and the Flit passing a check performed by the CRC circuitry.

* * * * *